United States Patent [19]

Kanazawa et al.

[11] Patent Number: 5,495,186
[45] Date of Patent: Feb. 27, 1996

[54] DIFFERENTIAL TYPE MOS TRANSMISSION CIRCUIT

[75] Inventors: Nobuaki Kanazawa, Akishima; Masao Mizukami, Yokohama; Kunihiro Ito, Ome, all of Japan

[73] Assignees: Hitachi, Ltd., Tokyo; Hitachi Communication Systems, Inc., Yokohama, both of Japan

[21] Appl. No.: 275,008

[22] Filed: Jul. 13, 1994

[30] Foreign Application Priority Data

Jul. 21, 1993 [JP] Japan .................................. 5-201092

[51] Int. Cl.$^6$ .............................................. H03K 3/2897
[52] U.S. Cl. .................. 326/83; 326/21; 326/30; 327/205
[58] Field of Search .................. 326/10, 21, 30, 326/23–24, 86, 83; 327/121, 247, 205–206; 375/76

[56] References Cited

U.S. PATENT DOCUMENTS

| 4,719,369 | 1/1988 | Asano et al. | 326/30 |
| 4,833,347 | 5/1989 | Rabe | 326/23 |
| 5,111,080 | 5/1992 | Mizukami et al. | 326/30 |
| 5,175,445 | 12/1992 | Kinugasa et al. | 327/205 X |
| 5,319,262 | 6/1994 | Cederbaum et al. | 326/21 X |

FOREIGN PATENT DOCUMENTS 2-143609   6/1990   Japan .

OTHER PUBLICATIONS

Kanazawa, Nobuaki, et al. "ATM CMOS LSI—CMOS High Speed Interface LSI for ATM Cell Transmission," Conference No. ICD92–27, Jun. 1992, Kumamoto Meeting 1992 of Study Group on Integrated Circuit, Electronic Information Communication Society, pp. 15–20. (This document is provided in Japanese; English translation unavailable to applicants' attorney.).

*Primary Examiner*—David R. Hudspeth
*Attorney, Agent, or Firm*—Fay, Sharpe, Beall, Fagan, Minnich & McKee

[57] ABSTRACT

A differential type MOS transmission circuit includes a signal driving circuit and a signal receiving circuit to realize high speed transmission for a short distance transmission between different LSIs, etc. A pair of transmission lines between the signal driving circuit and the signal receiving circuit are driven by a pair of drivers in the signal driving circuit so as to take either one of three states, i.e. one state where both of the lines are in a precharged states and two states where either one of the lines is in a discharged state. A signal driving circuit includes signal generating circuits generating variations in control signals varying pulse-like in response to rise and fall of an input signal to thereby obtain the discharge state. The signal receiving circuit generates an output signal depending on the state of the transmission lines and is constructed of a Schmitt trigger circuit with a hysteresis characteristic, for which an input threshold voltage for output logical values has a level smaller than a potential difference between the precharged level and the discharged level.

10 Claims, 16 Drawing Sheets

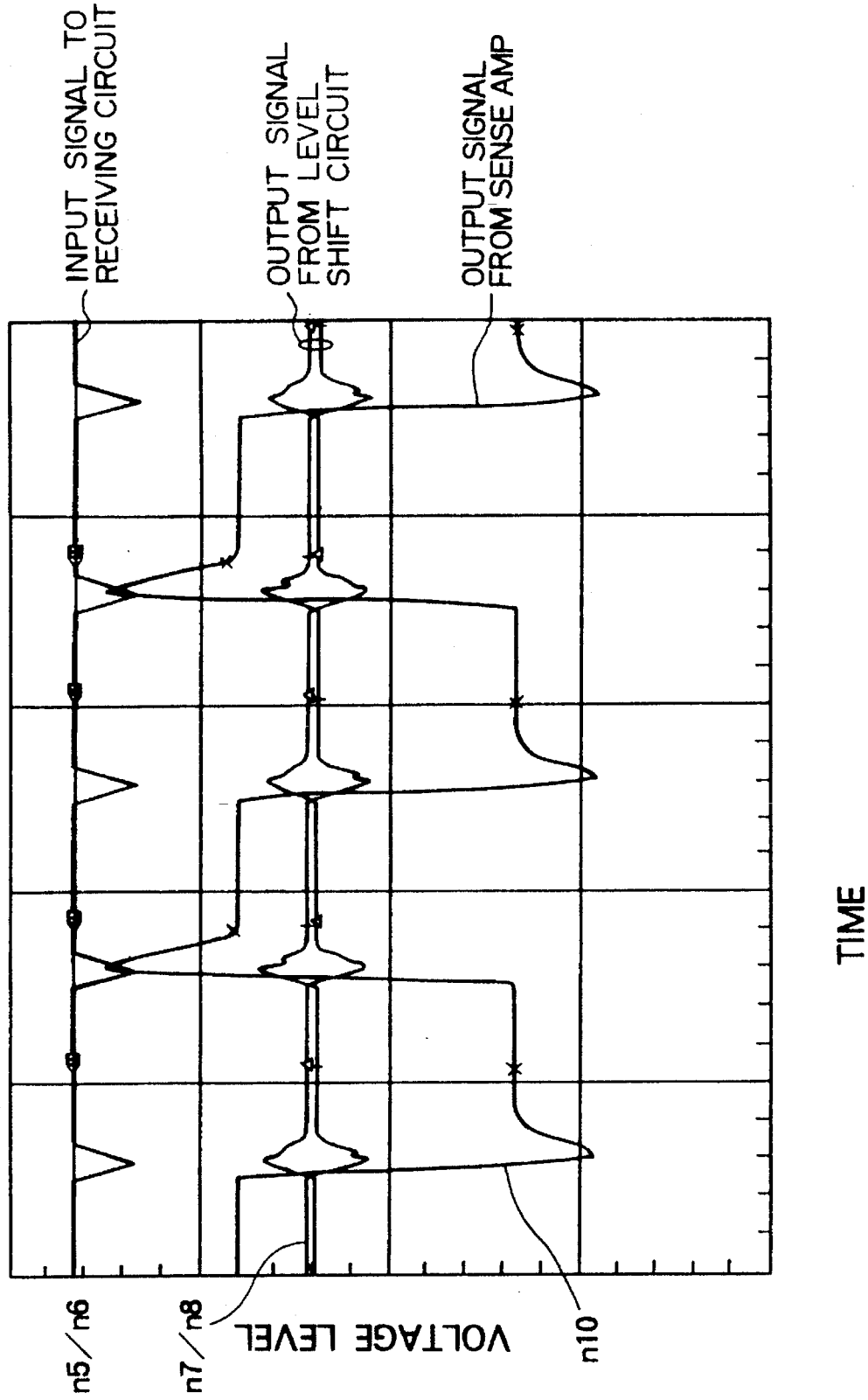

DIFFERENTIAL TYPE MOS TRANSMISSION CIRCUIT

BACKGROUND OF THE INVENTION

The present invention relates to a differential type MOS transmission circuit, more particularly to techniques useful specifically when used for signal transmission between LSIs on a circuit board for a digital processing device constructed mainly by using CMOS or bipolar.CMOS (BiCMOS) circuits.

By constructing a digital processing device mainly by using CMOS or BiCMOS circuits it is possible to achieve high speed performance, high density integration and low electric power consumption. In such a digital processing device, if signals transmitted between LSIs (semiconductor integrated circuits) mounted on a circuit board have relatively large signal amplitudes of MOS level such as e.g. 5 V, because of the relatively large signal amplitudes, when the number of transmitted signals or the length of transmission lines between different circuit boards or LSIs is increased with increasing scale of the digital processing device, high speed operation in the whole digital processing device is hindered and further electric power consumption is increased. That is, the signal transmission method in the digital processing device is an important factor dominating performance of a system.

Therefore the inventors of the present application have developed a signal transmission method for transmission lengths not more than 10 m prior to the present invention. The content thereof is disclosed in JP-A-2-143609 published on Jun. 1, 1990 and in an article "Conference No. ICD92-27 (June 1992)" Kumamoto Meeting 1992 of Study Group on Integrated Circuit, Electronic Information Communication Society. That is, in order to realize low electric power consumption and high speed transmission, transmission of low amplitude signals, e.g. signals having an amplitude of about 300 mV, utilizing differential signals is adopted by this method, by which a series resistance is inserted into a differential signal output terminal of relevant TTL level of an LSI having an output signal amplitude of TTL level, e.g. 0 V~3 V, so as to decrease the amplitude of the differential output signal of relevant TTL level by resistance voltage dividing with an impedance ratio determined by the series resistance and a terminal resistance. The differential signal having an amplitude reduced in this way is supplied to another LSI receiving circuit through a pair cable. The first stage of this receiving circuit serves both as a level shift circuit and as a preamplifier in common. The output of this first stage is amplified by a main amplifier to be supplied to an internal logic circuit in that LSI.

However it was revealed by the inventors of the present application that there is a problematical point as follows, in the case where high density integration or high density mounting of digital processing devices is advanced and signal transmission is effected by means of a number of transmission circuits described above. At first, operation speed of a driver on the transmitter side is inferior to requirement for a higher signal transmission speed. That is, although the signal amplitude on the pair cable is relatively reduced by resistance voltage dividing, since the amplitude of the output signal itself of the LSI is relatively high as the TTL level, the driver should perform output operation with a full swing of the amplitude of the output signal. For this reason there is a limit in increasing the speed of the output operation, i.e. the signal transmission speed. Secondly, since it is necessary to mount resistance elements on a circuit board for the resistance voltage dividing, the ratio of an area for mounting the relevant resistance elements on the circuit board to the whole surface of the circuit board increases, which lowers packaging efficiency of the circuit board.

SUMMARY OF THE INVENTION

An object of the present invention is to provide a differential type MOS digital small amplitude signal transmission circuit capable of realizing high speed transmission on a small transmission length, for which influences of impedance matching are small, between different chips, LSIs or the like on a circuit board.

Another object of the present invention is to provide a differential type MOS transmission circuit capable of increasing packaging efficiency on a circuit board in a digital processing device constructed mainly by using CMOS or bipolar.CMOS circuits free from resistance elements.

Typical aspects of the present invention for achieving the objects described above is as follows.

For example, as indicated in FIGS. 1 and 2, a differential type MOS transmission circuit according to one feature of the present invention comprises at least one signal driving circuit (UBD) including signal generating circuits for generating a first control signal (n1) exhibiting a differential waveform varying pulse-like, based on a transition of an input signal (do0) which is a signal to be transmitted which can have two logic values, from a first logic value to a second logic value and a second control signal (n2) exhibiting a differential waveform varying pulse-like, based on a transition of the input signal from the second logic value to the first logic value; a first driver (N5) whose output (n3) is connected with one transmission line (n5) and which discharges the corresponding one transmission line during a period of pulse-like variation of the first control signal and precharges the corresponding one transmission line during the other period; and a second driver (N8) whose output (n4) is connected with the other transmission line (n5) and which discharges the corresponding other transmission line during a period of pulse-like variation of the second control signal and precharges the corresponding other transmission line during the other period; thereby generating a precharged state of both the transmission lines and a discharged state of either one of the transmission lines; and a Schmitt trigger type signal receiving circuit (BR) whose input is connected with the pair of transmission lines described above and which amplifies in a differential manner a potential difference between the pair of transmission lines formed by discharge of either one of the transmission lines to generate an output signal (n10) which can have two logic values, at the same time provided with a hysteresis characteristic for which an input threshold voltage with respect to the two logic values has a level lower than a voltage difference between the precharged level and the discharged level, by positive feedback of the output signal.

Each of the first and second drivers (N5, N8) can be constructed of precharge MOSFET (Q1, Q3) and discharge MOSFET (Q2, Q4) having conductivity types different from each other and connected in series. In this way, the precharged level of the transmission lines can serve as power supply voltage. In order that no latch-up takes place in the drivers thus constructed by CMOSs, it is preferable to construct both the discharge and precharge MOSFETs by using N channel type MOSFETs. In this way, live-insertion of the circuit board on which an LSI having the first and second drivers in its output stage is mounted, becomes possible.

In order to make driving power of the first and second drivers (N5, N8) described above correspond easily to load capacity component of the transmission lines, it is desirable to provide a plurality of series circuits including precharge MOSFETs and discharge MOSFETs in parallel, depending on the load capacity thereof, as indicated in FIG. 9.

In the above description, the pair of transmission lines have three states in total, i.e. one state where both the transmission lines are precharged and two states where either one of the transmission lines is discharged.

According to another aspect of the present invention, in order to make the signal state on the pair of transmission lines completely differential, a differential type MOS transmission circuit comprises, e.g. as indicated in FIG. 11, at least a signal driving circuit (BD) including signal generating circuits for generating a first control signal (n1) exhibiting a differential waveform varying pulse-like, based on a transition of an input signal (do0) which is a signal to be transmitted which can have two logic values, from a first logic value to a second logic value and a second control signal (n2) exhibiting a differential waveform varying pulse-like, based on a transition of the input signal from the second logic value to the first logic value; a first driver (N5), whose output is connected with one transmission line (n5) set forcedly at a reference potential (e.g. VDD, VSS) and which discharges the corresponding one transmission line during a period of pulse-like variation of the first control signal and charges the corresponding one transmission line during a period of pulse-like variation of the second control signal; and a second driver (N8) whose output is connected with the other transmission line set forcedly at the reference potential and which discharges the corresponding other transmission line during a period of pulse-like variation of the second control signal and charges the corresponding other transmission line during a period of pulse-like variation of the first control signal, thereby forming three states in total, i.e. a state where both the transmission lines are at the reference potential and two states where either one of the transmission lines is at the precharged state and the other is at the discharged state; and a Schmitt trigger type signal receiving circuit (BR) whose input is connected with the pair of transmission lines described above and which amplifies in a differential manner a potential difference between the pair of transmission lines to generate an output signal (n10) which can have two logic values, and in which an input threshold voltage for the two logic values has a hysteresis characteristic with a level which is lower than a voltage difference between the reference potential and the charged level and in addition lower than a voltage difference between the reference potential and the discharged level, due to a positive feedback of the output signal.

The signal generating circuit described above can produce control signals varying pulse-like by using gate delay, as indicated in FIG. 1. For example, the signal generating circuit includes a first logic circuit (AND1) to which the input signal and a signal obtained by inverting logically the input signal and delaying the signal thus obtained are inputted and which produces the first control signal varying pulse-like during a period where both the inputs have a first logic value, and a second logic circuit (AND2) to which the signal obtained by inverting the input signal and a signal obtained by delaying the input signal are inputted and which forms the second control signal varying pulse-like during the period where both the inputs have the first logic value.

In order to increase stability of data transmission by defining the pulse width, etc. of the control signals varying pulse-like in the signal generating circuit described above with a high precision, it is preferable to make the signal generating circuit operate in synchronism with a clock (ck), as indicated in FIG. 6. For example, such a signal generating circuit includes a third logic circuit (AND3) which outputs the first control signal described above varying pulse-like with a pulse width of the clock (ck) with which variation timing of the input signal is synchronized, when the input signal which can have two logic values has the first logic value; a fourth logic circuit (AND4) which outputs the second control signal described above varying pulse-like with a pulse width of the clock (ck) with which variation timing of the input signal is synchronized, when the input signal, which can have two logic values, has the second logic value; and a fifth logic circuit (F/F1, F/F2, AND10, AND11, NOR) which determines whether the logic value of the input signal is in accordance with the logic value of the input signal in the directly preceding clock cycle or not and outputs a third control signal for preventing pulse-like variation of the first and the second control signal, when they are in accordance with each other.

Further the signal generating circuit detects the discharged level of the transmission lines to generate a control signal varying pulse-like, as indicated in FIG. 8, so that the discharged level of the transmission lines can be clamped. For example, such a signal generating circuit includes a level detecting circuit (LVD) which detects that the discharged level of the pair of transmission lines described above is lowered to a predetermined level; a sixth logic circuit (AND5) which receives the input signal capable of having two logic values, and a detection signal coming from the level detecting circuit described above and generating the first control signal varying pulse-like during a period from a point of time where the input signal is changed to the first logic value to a point of time where lowering of the discharged level is revealed by the detection signal; and a seventh logic circuit (AND6) which receives the input signal described above and the detection signal coming from the level detecting circuit described above and generates the second control signal varying pulse-like during a period from a point of time where the input signal is changed to the second logic value to a point of time where lowering of the discharged level is revealed by the detection signal.

The signal receiving circuit according to another aspect of the present invention can be constructed of a differential amplifying circuit (SA) and a level shift circuit (LS) which level-shifts the signal level of the pair of transmission lines connected with the input to a level in the neighborhood of an operating point of the differential amplifying circuit stated above to supply it thereto. At this time, in order to have the level shift circuit (LS) stated above have a hysteresis characteristic, the level shift circuit includes e.g. a pair of current amplifying circuits, each of which has an output terminal at a connecting point between an input MOSFET (Q9, Q10) and a load element (Q5, Q6) connected in series, the voltage at the output terminal being varied according to the input voltage to the input MOSFET; and feedback MOSFETs (Q7, Q8 or Q20, Q21) connected with the respective current amplifying circuits for enlarging the difference in the output level of the pair of transmission lines by inputting the output of the differential amplifying circuit for feedback.

In order to have the differential amplifying circuit (SA) bear the hysteresis characteristic of the signal receiving circuit, the level shift circuit (LS) includes a pair of current amplifying circuits, each of which has an output terminal at a connecting point between an input MOSFET and a load element connected in series, the voltage at the output terminal being varied according to the input voltage to the input MOSFET; the differential amplifying circuit (SA) includes a pair of differential input MOSFETs (Q30, Q31) connected with the output terminal of the current amplifying circuit; active loads (Q32, Q33) constituting a current mirror circuit connected with the pair of differential input MOSFETs; and feedback MOSFETs (Q35~Q39) connected with the respective differential input MOSFETs for enlarging the difference in the current flowing through each of the pair of differential input MOSFETs by inputting the output obtained from the connecting point between these active loads and one of the differential input MOSFETs for feedback.

In the operation of the circuit construction described above, it is supposed that the pair of transmission lines (L0) can have either one of three states by the drivers (N5, N8), i.e. a state where both of them are precharged, and two states where either one of the transmission lines is discharged. The signal generating circuit generates the control signals (n1, n2) varying pulse-like in response to rise and fall of the input signal (do0) and the discharged state of the transmission lines is controlled by these control signals. This secures that the amplitude of the output signals of the drivers in the signal driving circuit (UBD) are smaller than the potential difference between the power supply voltage for the corresponding drivers and that the drivers may effect output operation with small amplitudes. Further the signal receiving circuit (BR) may be constructed of a Schmitt trigger type circuit, in which the input threshold voltage for the output logic values has a hysteresis characteristic with a level lower than the potential difference between the precharged state and the discharged state. Consequently, in the signal receiving circuit, the output logic values are maintained, even if the discharged state of either one of the transmission lines is changed to the precharged state of both the transmission lines, and the relevant output logic values are inverted at the first time when the discharged state appears on the other transmission line. Consequently this signal transmission mode can realize a higher signal transmission speed and a lower electric power consumption owing to small amplitudes.

Further, since small signal amplitudes on the transmission lines can be realized without requiring any external resistance mounted externally to LSI on the circuit board, packaging efficiency on the circuit board in the digital processing device composed mainly of CMOSs or bipolar CMOSs can be increased.

BRIEF DESCRIPTION OF THE DRAWINGS

FIG. 4B shows a part of the waveform of operation signals indicated in FIG. 4A in detail;

DESCRIPTION OF THE PREFERRED EMBODIMENTS

Hereinbelow several embodiments of the present invention will be explained in detail with reference to the accompanying drawings.

Figure 3:
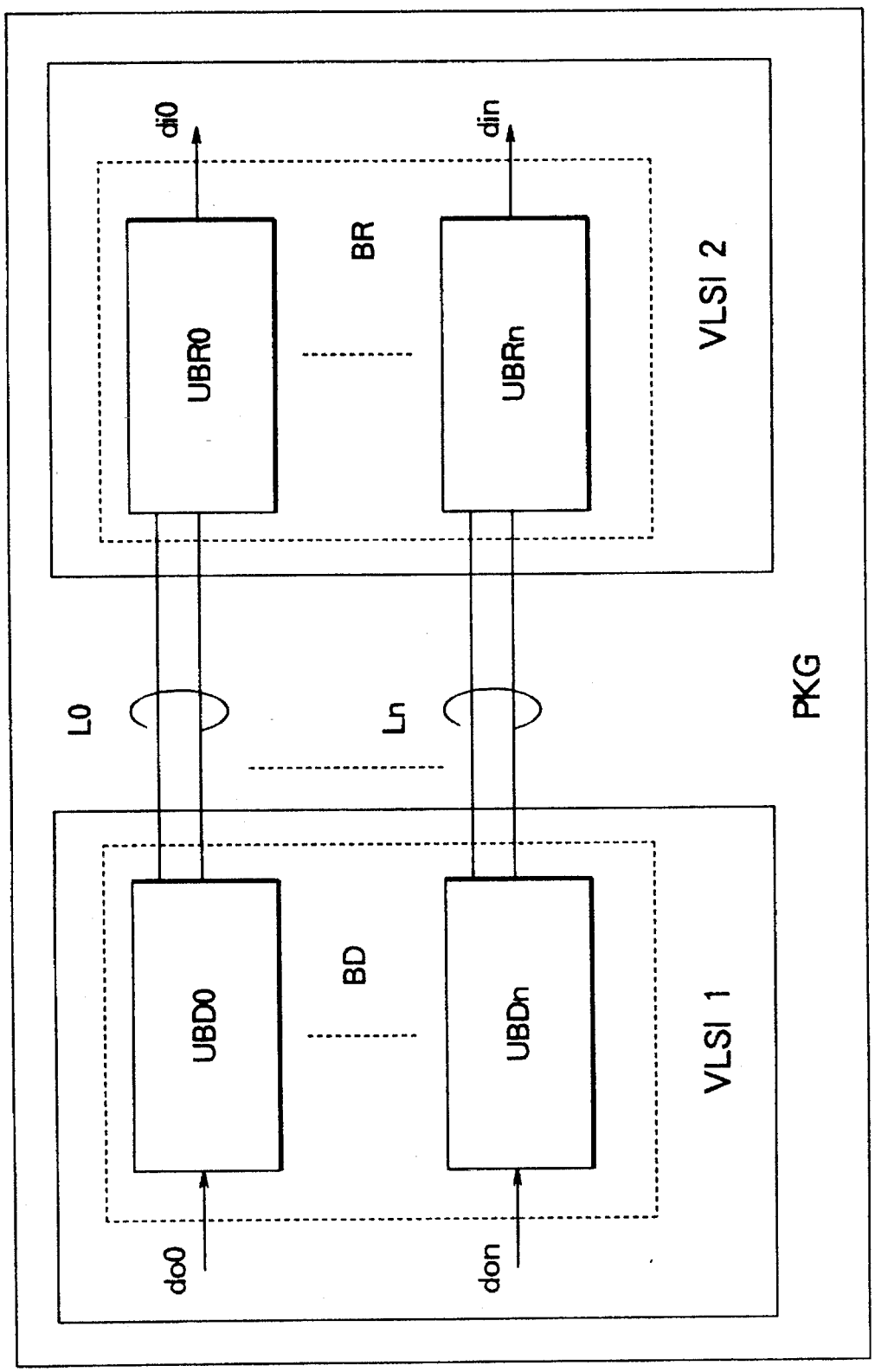
FIG. 3 is a block diagram showing an example of a digital processing device, to which an embodiment of a differential type MOS transmission circuit is applied.

In FIG. 3, an example of the digital processing device to which an embodiment of the differential type MOS transmission circuit according to the present invention is applied, is indicated in a block diagram. Although the digital processing device in this embodiment is not specifically limited, it is contained in an ATM (Asynchronous Transfer Mode) switchboard used in a general digital communication network, i.e. ISDN (Integrated Services Digital Network System). Although the digital processing device in this embodiment is not specifically limited, it includes a number of electronic circuit packages, e.g. circuits boards, on which a plurality of semiconductor circuits are mounted, mounted on one or a plurality of racks and these packages are connected with each other through signal lines. In this embodiment, each of the electronic circuit packages constituting the digital processing device is composed mainly of CMOS or bipolar.CMOS circuits, although they are not limited thereto. In this way it is tried to increase integration density and to lower power consumption in the digital processing device while realizing a predetermined high speed performance. In FIG. 3, PKG represents one of the electronic circuit packages constituting the digital processing device and two large scale integrated circuit devices VLSI1 and VLSI2 typically indicated there are connected by transmission lines L0–Ln. These large scale integrated circuit devices VLSI1 and VLSI2 constitute different functional blocks in the electronic circuit package. Hereinbelow the embodiment will be explained around the signal transmission method between these large scale integrated circuit devices VLSI1 and VLSI2.

In FIG. 3, the large scale integrated circuit device VLSI1 includes a signal driving circuit BD including a plurality of unit driving circuits UBD0~UBDn (hereinbelow generally called simply unit driver UBD) having a mutually identical construction. In this embodiment, the unit drivers UBD constituting the signal driving circuit BD are mounted in an I/O circuit section disposed in the large scale integrated circuit device VLSI1, although they are not restricted specifically thereto. For example corresponding internal output signals do0~don are supplied from a preceding stage not indicated in the figure in the large scale integrated circuit device VLSI1 to the unit drivers UBD constituting the signal driving circuit BD, although they are not restricted specifically thereto. The internal output signals do0~don are such signals of MOS level that the logic high level thereof is about the power supply voltage VDD (e.g. +5 V) and the logic low level thereof is the ground potential of the circuit (e.g. 0 V), although they are not restricted specifically thereto.

In FIG. 3, the large scale integrated circuit device VLSI2 includes a signal receiving circuit BR including a plurality of unit receiving circuits UBR0~UBRn (hereinbelow generally called simply unit receiver UBR) having a mutually identical construction. In this embodiment, the unit receivers UBR constituting the signal receiving circuit BR are mounted in the I/O circuit section disposed in the large scale integrated circuit device VLSI2. The inputs of the unit receiving circuits UBR constituting the signal receiving circuit BR are connected with the corresponding transmission lines L0~Ln and the respective outputs, which are internal input signals di0~din, are supplied to a succeeding circuit not indicated in the figure in the digital processing device.

Figure 1:
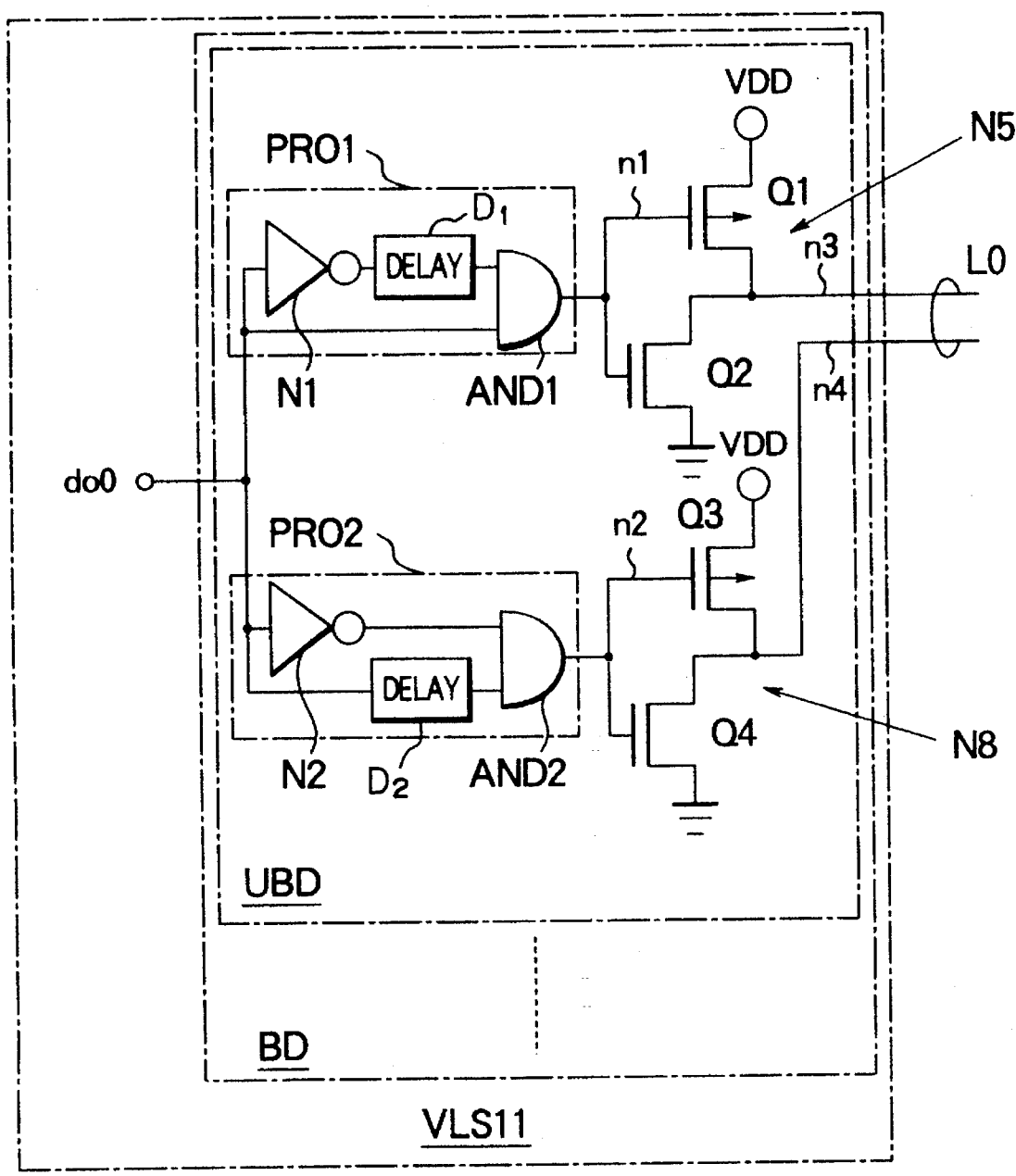
FIG. 1 is a circuit diagram showing an embodiment of a unit driving circuit according to the present invention.
Figure 2:
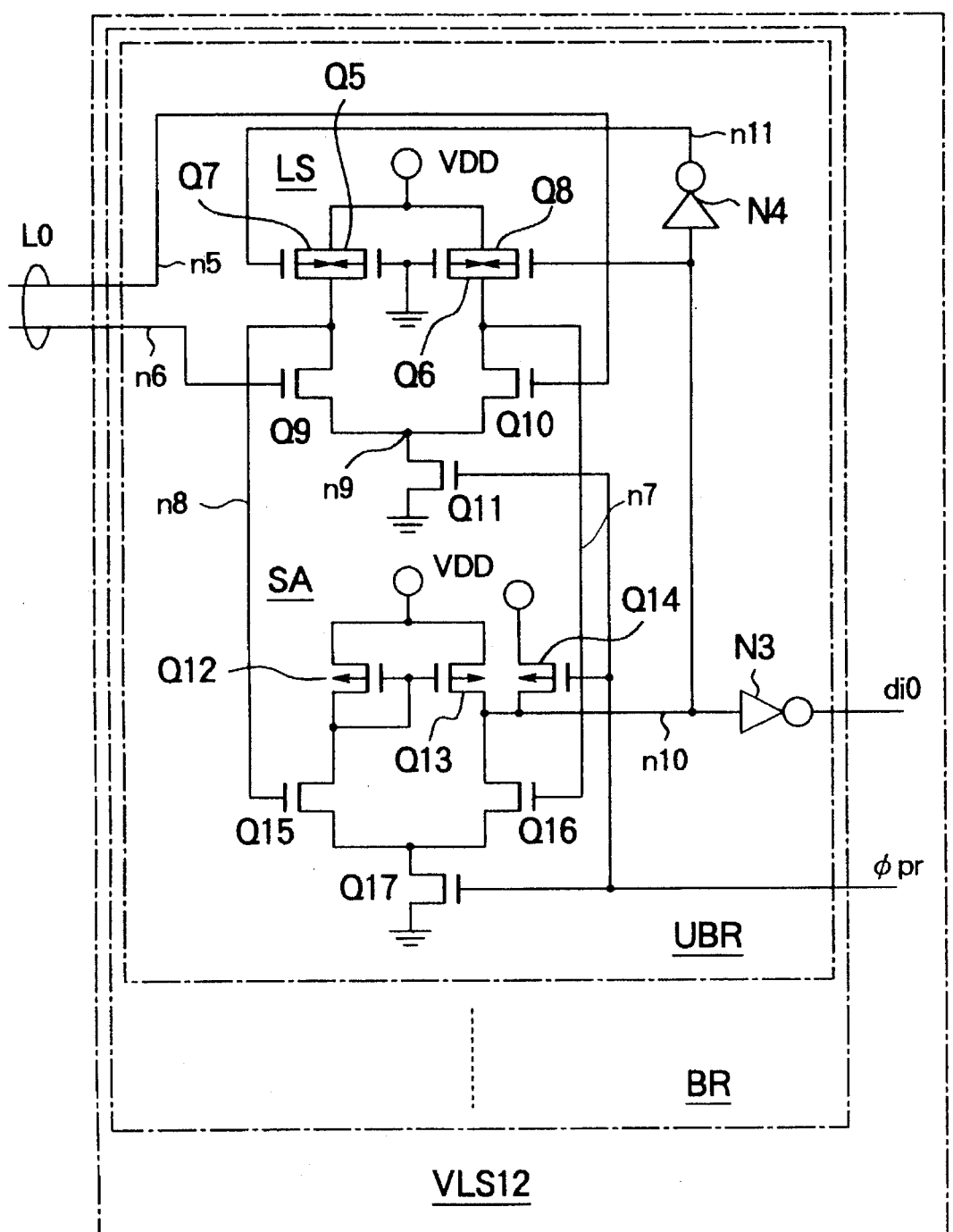
FIG. 2 is a circuit diagram showing an embodiment of a unit receiving circuit according to the present invention.

FIG. 1 shows an example of the unit driver UBD, while FIG. 2 shows an example of the unit receiver UBR. FIG. 4 shows waveform of operation signals in the circuits indicated in FIGS. 2 and 1. In the figures, which will be explained below, MOSFETs (insulated gate type field effect transistors), for each of which an arrow is attached to the channel (back gate) section, are of P channel type, which are distinguished from N channel type MOSFETs, to which no arrows are attached.

Each of the unit drivers UBD constituting the signal driving circuit BD includes two sets of inverter type drivers N5, N8 (called also output circuits) including N channel type MOSFETs (discharge MOSFETs) Q2 and Q4 as well as P channel type precharge MOSFETs Q1 and Q3; a signal generating circuit PRO1 outputting a pulse signal (waveform obtained by differentiating rise of an input pulse) to the output terminal n1 at rise of the internal output signal do0; and a signal generating circuit PRO2 outputting a pulse signal (waveform obtained by differentiating fall of an input pulse) to the output terminal n2 at fall thereof, as indicated as an example in FIG. 1, although it is not restricted specifically thereto. The pulse signal n1 is supplied to the MOSFET Q1 and Q2 among them at the rise of the internal output signal do0, while the pulse signal n2 is supplied to the MOSFET Q3 and Q4 at the fall of the internal output signal do0. A drain connected in common of the MOSFETs Q1 and Q2 serves as an inverted output terminal n3 of each of the unit drivers UBD, while a drain connected in common of the MOSFETs Q3 and Q4 serves as an not inverted output, terminal n4 of each of the unit drivers UBD.

When the internal output signal do0 is constant at a high or low level, an output of the MOS inverter circuit N1 which is one of input signals to the logic product circuit AND1 incorporated in the signal generating circuit PRO1 is at a high level or a low level, while do0 which is the other input signal, is at a low level or a high level. Therefore the logical product output n1 of the signal generating circuit PRO1 is at a low level. Receiving the low level of the logical product output n1, the precharge MOSFET Q1 is turned to ON state and the driving MOSFET Q2 is turned to OFF state. Therefore the output terminal n3 of each of the unit driver UBD is at a high level such as the power supply voltage VDD of the circuit. At this time, an output of the MOS inverter circuit N2 which is one of input signals to the logical product circuit AND2 incorporated in the signal generating circuit PRO2 is at a high level or a low level, while do0 which is the other input signal is at a low level or a high level. Therefore the logical product output n2 of the signal generating circuit PRO2 is at a low level. Since, receiving the low level of the logical product output n2 described above, the precharge MOSFET Q3 is turned to ON state and the driving MOSFET Q4 is turned to OFF state, the output terminal n4 of each of the unit drivers UBD is at the high level such as the power supply voltage VDD of the circuit.

When the internal output signal do0 is turned from the high level to the low level, a pulse of high level is outputted as the output signal n1 of the signal generating circuit PRO1, corresponding to a delay time determined by a delay circuit D1. Upon receiving it, the inverted output signal n3 of the unit driver UBD drops by about 0.5 V from the high level of the power supply voltage to be turned to the low level for the transmitted signal, although this is not restricted specifically thereto. Thereafter a pulse of low level is outputted as the output signal n1 of the signal generating circuit PRO1. Upon reception of it, the inverted output signal n3 of the unit driver UBD is turned to the high level such as the power supply voltage VDD of the circuit. The low level of the transmitted signal is determined by the load capacity of the transmission lines, the magnitude of the driving MOSFETs and the output pulse width of the signal generating circuit. When the internal output signal do0 is turned from the high level to the low level, a pulse of high level is outputted as the output signal n2 of the signal generating circuit PRO2, corresponding to a delay time determined by a delay circuit D2. Receiving it, the non-inverting output signal n4 of the unit driver UBD drops by about 0.5 V from the high level of the power supply voltage to be turned to the low level for the transmitted signal, although this is not restricted specifically thereto. Thereafter a pulse of low level is outputted as the output signal n2 of the signal generating circuit. Receiving it, the non-inverting output signal n4 of the unit driver UBD is turned to the high level such as the power supply voltage VDD of the circuit. That is, when the internal output signal do0 varies, a pulse of low level of the transmitted signal is outputted as either one of the inverting output signal n3 and the non-inverting output signal of the unit driver UBD, depending on the direction of the variation corresponding to the delay time determined by the delay circuit.

The output terminals n3 and n4 of each of the unit drivers UBD of the signal driving circuit BD are connected with the respective transmission lines L0. The transmission lines L0 are connected, at the reception terminal thereof, with the inverting input terminal n5 and the non-inverting input terminal n6, respectively, of the corresponding unit receiver UBR in the signal receiving circuit BR contained in the large scale integrated circuit device VLSI2.

Each of the unit receivers UBR constituting the signal receiving circuit BR includes a level shift circuit LS and a sense amplifier SA, as indicated as an example in FIG. 2, although it is not restricted thereto. As described previously, the inverting input terminal n5 and the non-inverting input terminal n6 of the unit receiver UBR are connected with the corresponding transmission lines L0 and the output signal thereof, i.e. internal input signal di0, is supplied to a utilization succeeding circuit not indicated in the figure in the digital processing device. Further a timing signal φpr is supplied from a control circuit not indicated in the figure in the digital processing device to the unit receiver UBR. This timing signal φpr is at a low level such as the earth potential in a usual circuit and when the signal receiving circuit BR should be set at an operating state, it is set selectively at a high level such as the power supply voltage VDD of the circuit.

The level shift circuit LS constituting each of the unit receiver UBR includes N channel type differential MOSFETs Q9 and Q10; and P channel MOSFETs Q7 and Q7 as well as Q6 and Q8 provided at the respective sources of these input differential MOSFETs Q9 and Q10, which are connected in parallel with each other. The sources of the MOSFETs Q5 and Q7 as well as the MOSFETs Q6 and Q8 are connected with the power supply voltage VDD and the sources of the MOSFETs Q9 and Q10 which are connected in common, are connected with the ground potential of the circuit through an N channel type power switch MOSFET Q11.

The gates of the input MOSFETs Q9 and Q10 described above are connected with the non-inverting input terminal n6 and the inverting input terminal n5, respectively, of each of the unit receivers UBR and further with the corresponding transmission lines L0, as described previously.

The inverting output signal n10 of the sense amplifier SA is connected with the gate of the MOSFET Q8 and a non-inverting output signal n11 obtained by inverting the inverting output signal n10 stated above by means of the MOS inverter circuit N4 is inputted to the gate of the MOSFET Q7. The timing signal φpr described above is supplied to the gate of the power switch MOSFET Q11. Further drain potentials of the MOSFETs Q9 and Q10 are supplied to the corresponding sense amplifier SA as the inverted output signal n8 and the non-inverting output signal n7, respectively, of the level shift circuit LS.

The level shift circuit LS thus constructed of each of the unit receivers UBR is turned selectively to an operating state by the fact that the timing signal φpr is turned to the high level and the power switch MOSFET Q11 is set to the ON state. In this state, the power supply voltage VDD is supplied to one of the inverting input terminal n5 and the non-inverting input terminal n6 of each of the unit receivers UBR through the corresponding transmission lines L0 and a received signal having a small amplitude due to a variation on the power supply voltage VDD side is inputted to the other. In this way both the MOSFETs Q9 and Q10 in the level shift circuit LS are turned to the ON state. Therefore the drain potentials of the MOSFETs Q9 and Q10, i.e. the inverting output signal n8 and the non-inverting output signal n7 vary in the reverse phase with respect to the inverting signal n5 and the non-inverting signal n6 around a predetermined bias level decided by a conductance ratio determined by the MOSFETs Q5, Q7 and Q9 or a conductance ratio determined by the MOSFETs Q6, Q8 and Q10, At this time, a ratio of a synthesized impedance of the MOSFETs Q5 and Q7 to a synthesized impedance of the MOSFETs Q6 and Q8 varies due to the fact that the output signals n11 and n10 of the sense amplifier SA, which are in phase with respect to the inverting input signal n5 and the non-inverting input signal n6, respectively, are inputted to the gates of the MOSFETs Q7 and Q8 and thus a further greater level difference is formed between the inverting output signal n8 and the non-inverting output signal n7 of the level shift circuit LS. That is, the level difference between the inverting output signal n8 and the non-inverting output signal n7 obtained by the variation in the input to the level shift circuit LS is increased by the positive feedback of the output of the sense amplifier SA. Consequently the level shift circuit LS has a hysteresis characteristic in the input and output thereof owing to effect of the positive feedback. In other words, input offset can be obtained by varying the synthesized impedance ratio of the load MOSFETs of the MOSFETs Q9 and Q10, depending on the state of differential inputs to the latter.

Figure 4A:
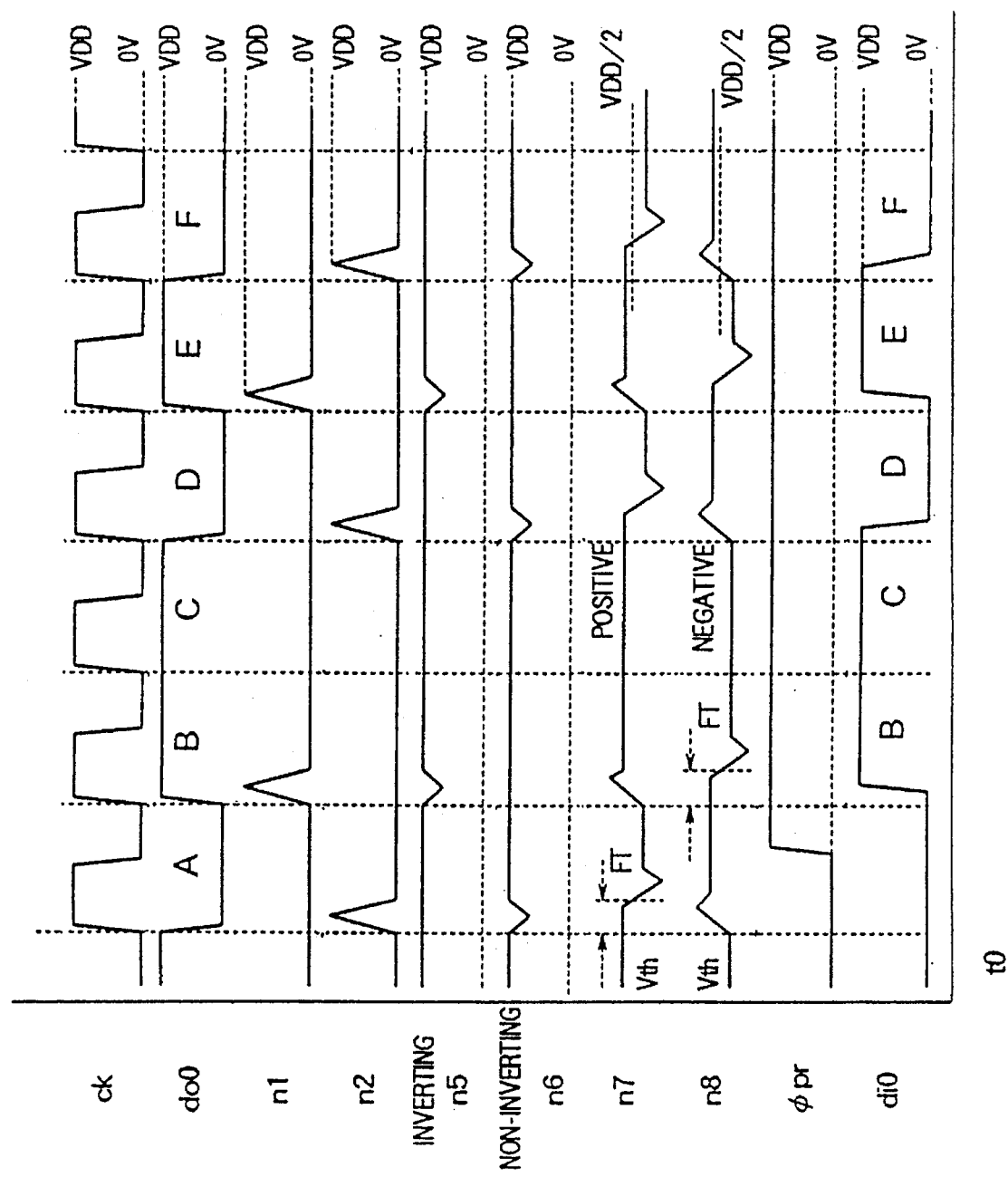
FIG. 4A is a diagram showing waveform of operation signals in the circuits indicated in FIGS. 1 and 2.

The hysteresis characteristic described above will be explained more in detail. When the input signal n6 is turned to the low level in synchronism with variations at a point of time t0 of the clock signal ck in FIG. 4A, ON resistance of the input MOSFET Q9 is relatively increased and the level of the output signal n8 is raised e.g. by 300 mV witch respect to VDD/2. An extremely small level difference between the output signals n8 and n7 due to this rise in the level is amplified by the sense amplifier SA and the outputs n10 and n11 thereof are fedback to the MOSFETs Q7 and Q8. In this way the synthesized impedance of the MOSFETs Q5 and Q7 is decreased and at the same time the synthesized impedance of the MOSFETs Q6 and Q8 is increased, which has a tendency to lower the level of the output n7 and to raise the level of the output n8. As the result, the level difference between the outputs n7 and n8 is increased e.g. to about 600 mV, which is twice as great as the original value. A period of time FT in FIG. 4A represents an operation delay time until the positive feedback begins to operate.

Figure 5:
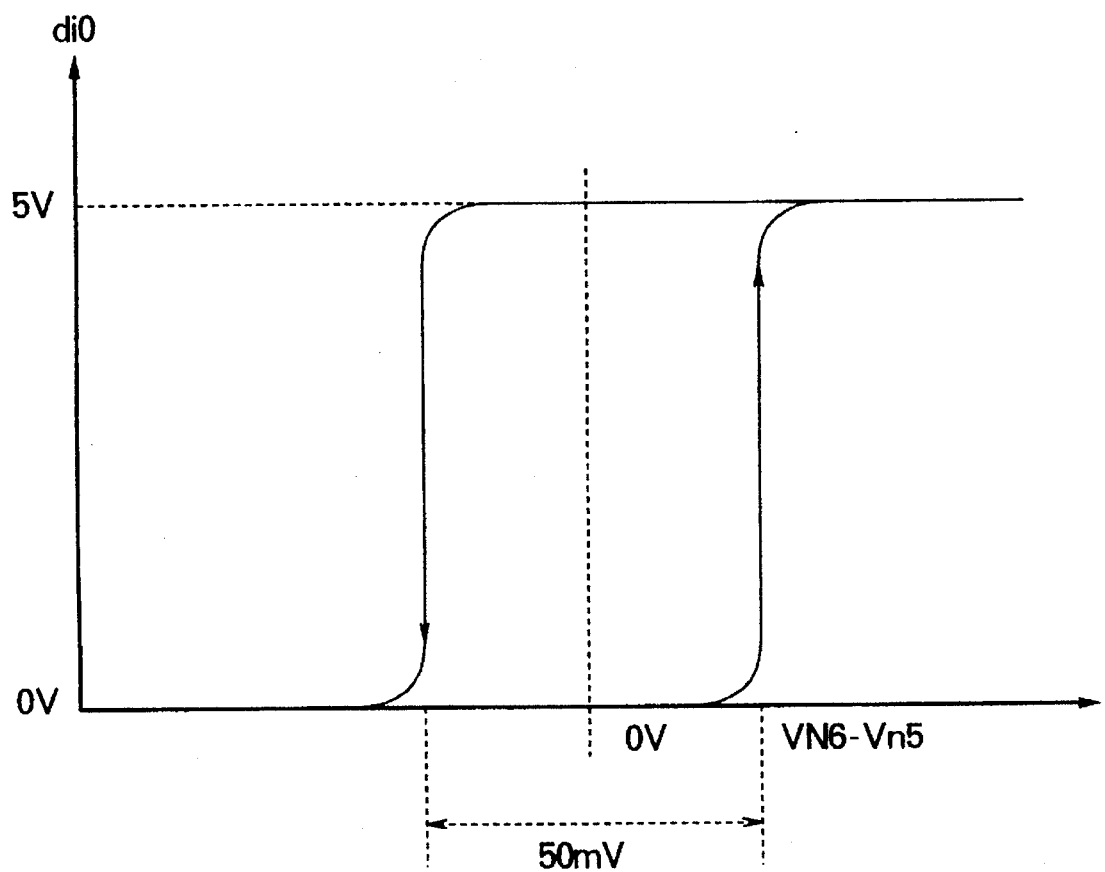
FIG. 5 is a diagram for explaining an example of a hysteresis characteristics of the level shift circuit indicated in FIG. 2.

The enlarged level difference obtained in the outputs n7 and n8 by such a feedback realizes the hysteresis characteristic indicated e.g. in FIG. 5. That is, it is possible to obtain a hysteresis characteristic e.g. of 50 mV in the level difference of Vn5 (voltage level of the input signal n5) with respect to Vn6 (voltage level of the input signal n6) for the threshold voltage for the high level output and the low level output, i.e. 0 point of the voltage difference between the two outputs.

Consequently, even if both the input signals n5 and n6 are turned to the high level, after either one of them has been changed to the low level, the output signal of the unit receiver UBR, i.e. the internal input signal di0, keeps the output signal level up to that time, e.g. a fraction of 300 mV peak-to-peak. As described above, the unit receiver UBR acts as a Schmitt trigger type receiving circuit having a hysteresis.

The inverting output signal n8 and the non-inverting output signal n7 in the unit receiver UBR described above vary around a predetermined bias level decided by the conductance ratio of the MOSFETs Q5, Q7 and Q9 or the MOSFETs Q6, Q8 and Q10. The bias level is set at an about middle level between the power supply voltage VDD and the ground potential, i.e. VDD/2, although it is not restricted specifically thereto. As a result, the DC level of signals transmitted through the transmission lines L0 is shifted by the level shift circuit LS so that an efficient bias level for which sensitivity of the sense amplifier SA is maximum can be obtained.

The sense amplifier SA constituting each of the unit receivers UBR includes N channel type differential MOSFETs Q15 and Q16 and a pair of P channel MOSFETs Q12 and Q13 disposed on the drain side of these differential MOSFETs, as indicated in FIG. 2, although it is not restricted thereto. The sources of the MOSFETs Q12 and Q13 are connected with the power supply voltage VDD of the circuit and an N channel type power switch MOSFET Q17 is disposed between the sources connected in common of the MOSFETs Q15 and Q16 and the ground potential. The gate of the MOSFET Q12 is connected with the drain thereof and further with the gate of the MOSFET Q13. In this way the MOSFETs Q12 and Q13 constitute a current mirror circuit and act as an active load for the differential MOSFETs Q15 and Q16. The inverting output signal n8 and the non-inverting output signal n7 of the level shift circuit LS are supplied to the gates of the MOSFETs Q15 and Q16, respectively, and the timing signal φpr is supplied to the gate of the power switch MOSFET Q17.

The drain potential of the MOSFET Q16 is supplied to the input terminal of the CMOS inverter circuit N3 as the inverting output signal n10 of the sense amplifier SA. Between the input terminal of this CMOS inverter circuit N3 and the power supply voltage VDD of the circuit there is disposed the P channel type preset MOSFET Q14, the gate of which receives the timing signal φpr, although it is not restricted specifically thereto. The output signal of the CMOS inverter circuit N3 is the output signal of the unit receiver UBR, e.g. the internal input signal di0, which is supplied to a. succeeding stage circuit not indicated in the figure in the digital processing device.

When the timing signal φpr described above is turned to the low level, the power switch MOSFET Q17 is set to the OFF state in the sense amplifier SA. For this reason, the sense amplifier SA is set to a non-operating state and the drain potential of the MOSFET Q16, i.e. the inverting output signal n10 has a tendency to be at an undetermined level. However, since the preset MOSFET Q14 is turned to the ON state due to the fact that the timing signal φpr is turned to the low level, the inverting output signal n10 is turned forcedly to the high level such as the power supply voltage VDD of the circuit. In this way the level of the internal input signal di0, which is the output signal of the CMOS inverter circuit N3, is fixed at the low level, regardless of the level of the complementary signals n7 and n8, as indicated in FIG. 4A.

On the contrary, when the timing signal φpr is turned to the high level, the power switch MOSFET Q17 is set to the ON state and the preset MOSFET Q14 is set to the OFF state in the sense amplifier SA. For this reason, the sense amplifier SA is set to an operating state. At this time, the central level of the signal transmitted through the corresponding transmission lines L0 is shifted by the level shift circuit LS, as described previously, and transmitted to the sense amplifier SA as the complementary signals n7 and n8 having a bias level such as VDD/2. In this embodiment, as explained previously, the sense amplifier SA is designed so that the amplification factor is maximum at the bias level of VDD/2 described above.

The complementary signals n7 and n8 are amplified and the level difference therebetween is magnified by the fact that the sense amplifier SA is turned to the operating state. In this way, the drain potential of the MOSFET Q16, i.e. the inverted output signal n10, is in phase with respect to the inverting input signal n8 and varies, enlarged by the amplification factor of the sense amplifier SA. As a result, as indicated in FIG. 4A, the internal input signal di0 of MOS level varying in phase with respect to the internal output signal do0 is obtained. FIG. 4B shows a relation in operating waveform among the input signal to the receiving circuit, the output signal from the level shift circuit and the output signal from the sense amplifier SA.

According to the embodiment described above, the pair of transmission lines L0 is set by the driver at either one of three states, i.e. one state where both of them are precharged and two states where either one of them is discharged. The discharged state is obtained by generating pulse-like variations of the control signals n1 and n2 varying pulse-like in response to rise and fall of the input signal do0, by means of the signal generating circuits PRO1 and PRO2. Consequently the amplitude of the output signal of the driver in the signal driving circuit BD is made smaller than the potential difference between the power supply voltage VDD and the ground potential and the driver can effect output operation with small amplitudes. On the other hand, the signal receiving circuit BR is constructed so as to be of Schmitt trigger type, for which the input threshold voltage for the output logic values has a hysteresis characteristic having a level smaller than the potential difference between the precharged level and the discharged level. In this way the output logic value is kept in the signal receiving circuit BR, even if the state where either one of the transmission lines is discharged is changed to the state where both of them are precharged, and the relevant output logic values are inverted, only when the discharged state appears on the other transmission line. Therefore the form for the signal transmission according to the present embodiment can realize a high signal transmission speed and a low electric power consumption. Further, since small amplitudes of signals on the transmission lines can be realized without requiring any external resistances mounted externally on the circuit board, it is possible to increase packaging efficiency on the circuit board of the digital processing device composed mainly of CMOS or bipolar.CMOS circuits.

Figure 6:
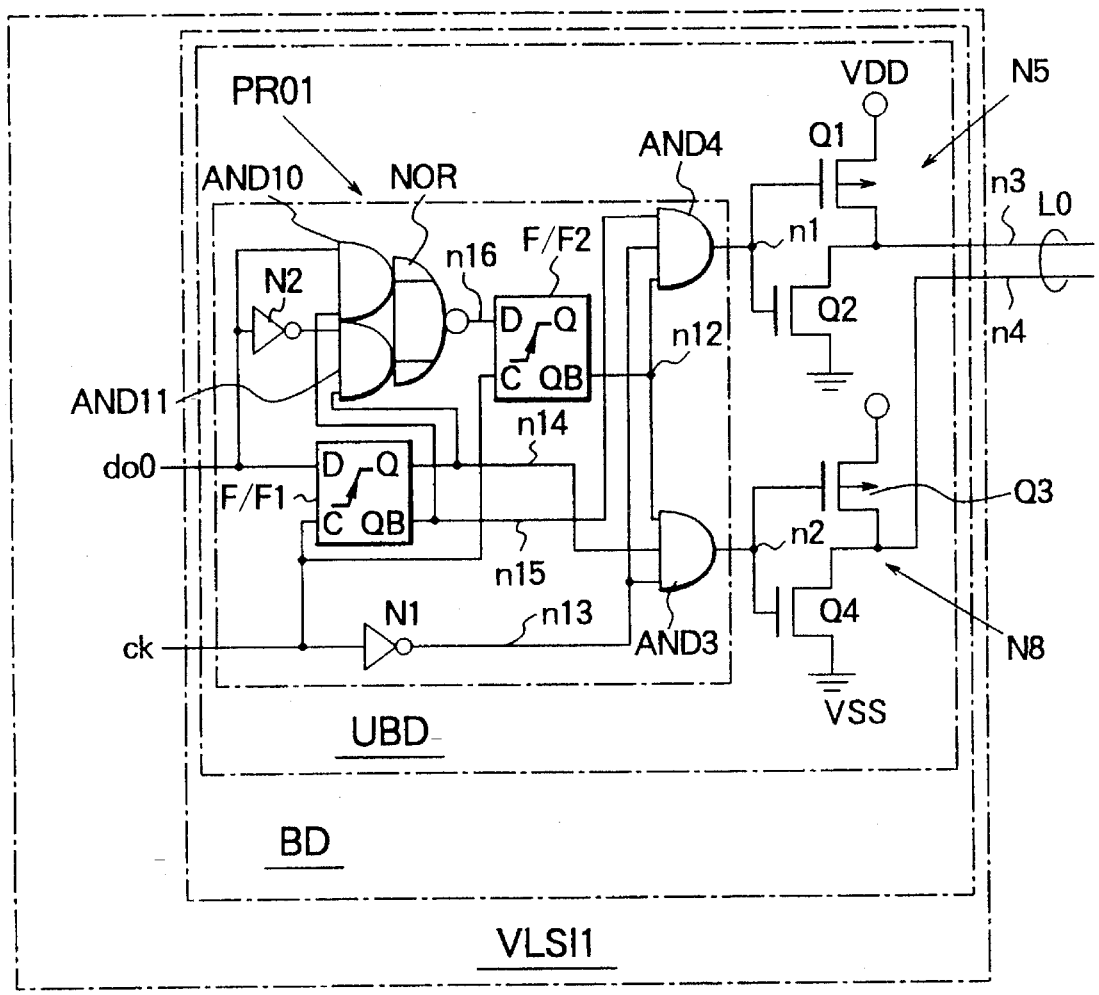
FIG. 6 is a circuit diagram showing another embodiment of a signal driving circuit according present invention.
Figure 7:
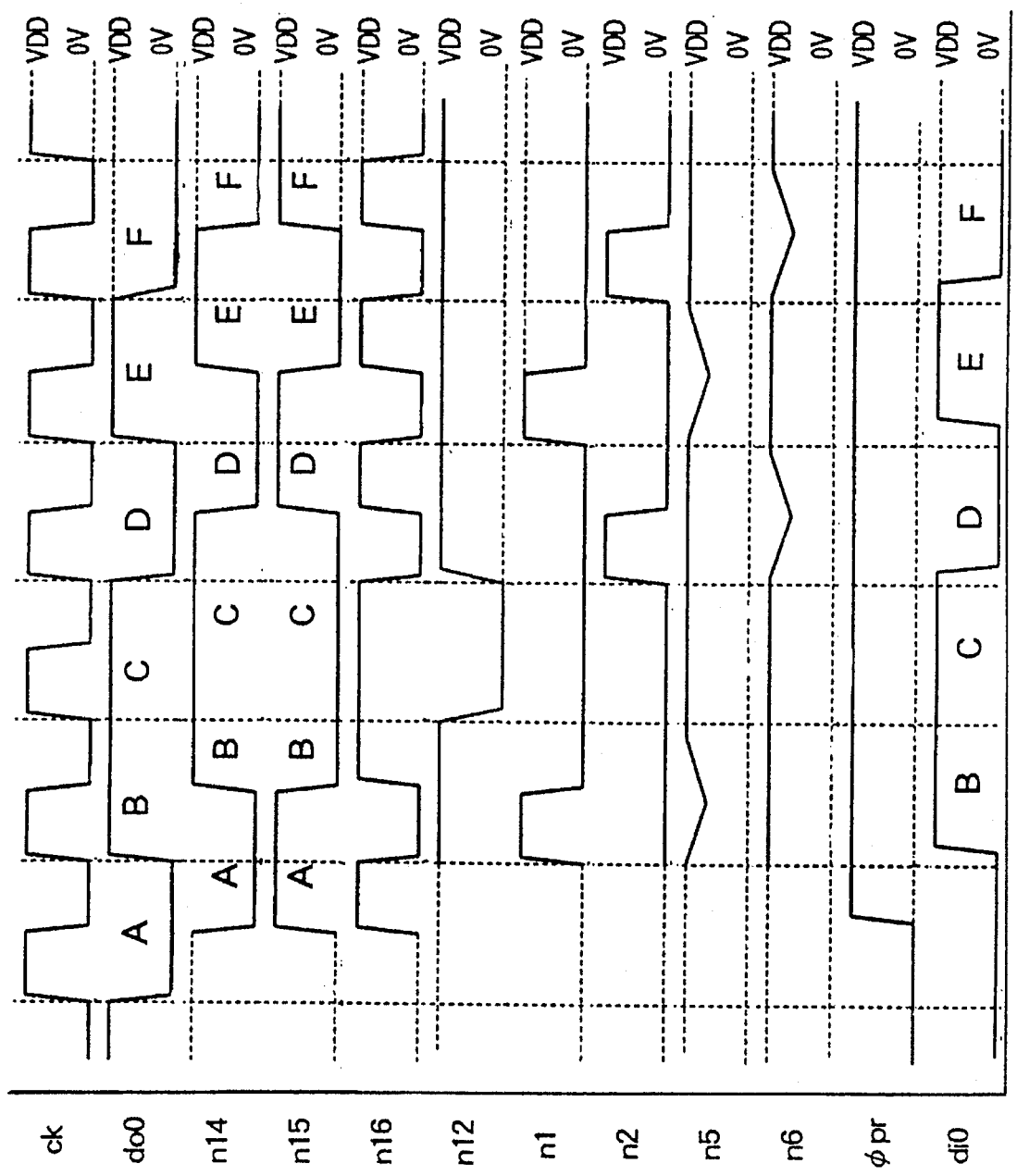
FIG. 7 is a diagram showing waveform of operation signals when the signal driving circuit indicated in FIG. 6 and the signal receiving circuit indicated in FIG. 2 are connected through transmission lines.

FIG. 6 shows a circuit according to a second embodiment of the signal driving circuit BD. The signal generating circuit in the signal driving circuit indicated in FIG. 1 utilizes gate delay. Instead thereof, a signal generating circuit driven in synchronism with the clock signal ck is adopted in the present embodiment. Also the signal driving circuit BD indicated in the figure is connected with such a signal receiving circuit BR as indicated in FIG. 2 through transmission lines L0. FIG. 7 shows operating waveforms, when the signal driving circuit BD indicated in FIG. 6 is connected with the signal receiving circuit BR indicated in FIG. 2 through the transmission lines L0.

The unit driver UBD indicated in FIG. 6 includes a signal generating circuit PRO1 driven in synchronism with the internal output clock signal ck, although it is not specifically restricted thereto. This signal generating circuit PRO1 is so designed that, in the case where logical values of internal output signals do0 supplied one after another in synchronism with the clock signal ck are in accordance with logical values in a preceding clock cycle, output operation (discharge operation of the transmission lines) of an output circuit (CMOS inverter including MOSFETs Q1 and Q2, CMOS inverter including MOSFETs Q3 and Q4) is stopped, in order to lower electric power consumption and to improve stability. That is, flip-flops F/F1 and F/F2 included in the signal generating circuit PRO1 are edge trigger type flip-flops, although they are not restricted thereto. Data inputted to a data input terminal D are kept at rise of clock signals ck inputted through the an input terminal C and inverting output data are outputted through an output terminal QB.

There are disposed logic product circuits AND 10 and AND 11 as well as a negative logical sum circuit (NOR gate) NOR between output terminals Q and QB of the flipflop F/F1, to a data input terminal of which the internal output signal is inputted, and a data input terminal D of the flip-flop F/F2. The internal output signal do0 and the signal obtained by inverting it through the inverter N2 are inputted to one of the inputs of each of the logic product circuits AND10 and AND11, respectively, while an output through an output terminal QB and an output through an output terminal Q of the flip-flop F/F1 are supplied to the other terminals, respectively. Each of the logical product circuits AND 3 and AND4 has three inputs and the clock signal obtained by inverting the phase of the clock ck and the output of the inverting output terminal QB of the flip-flop F/F2 are supplied to both the logical product circuits in common. Further the output from the output terminal Q of the flip-flop F/F1 is supplied to the logical product circuit AND3, while the output from the inverting output terminal QB of the flip-flop F/F1 is supplied to the logical product circuit AND4. According to the present embodiment, determination of the outputs with respect to the inputs of the flip-flops F/F1 and F/F2 is retarded by a half cycle of the clock ck. Consequently the output is determined by the logical value of the present signal do0 synchronized with the clock ck and the logical value, which the flip-flop F/F1 has latched for the signal do0 of the directly preceding cycle. In this way the signal generating circuit PRO1 determines whether the logic value of the internal output signal do0 is in accordance with the logic value of the directly preceding clock cycle or not.

In the signal generating circuit PRO1, the internal output signal do0 is observed by the flip-flops F/F1 and F/F2. When the signal do0 is constant at the high level or the low level, the internal terminal n12 is set at the low level, owing to which the output terminals n1 and n2 of the logical product circuits AND3 and AND4 are fixed at the low level. In this way the precharge MOSFETs Q1 and Q3 are turned to the ON state by receiving the logical product outputs n1 and n2 described above, while the driving MOSFETs Q2 and Q4 are turned to the OFF state. Therefore the output terminals n3 and n4 of the unit driver UBD are turned to the high level such as the power supply voltage VDD of the circuit.

When the internal output signal do0 is changed from the low level to the high level, a high level signal is outputted from the output terminal n12 of the flip-flop F/F2 included in the signal generating circuit PRO1, while a high level signal, which is the inverting output signal of the directly preceding signal do0, is outputted from the output terminal QB of the flip-flop F/F1. At the same time the internal output clock signal ck is turned to the low level and a high level signal is outputted to the MOS inverter circuit N1. Owing to this fact, the output of the logical product circuit AND4, i.e. the output terminal n1 of the signal generating circuit PRO1, is turned to the high level. When the unit driver UBD receives it, the inverting output signal n3 thereof drops by about 0.5 V from the high level of the power supply voltage to be turned to the low level of the transmitted signal, although it is not restricted specifically thereto. Thereafter, the internal clock signal ck is turned to the high level and a low level signal is outputted from the output n13 of the MOS inverter circuit N1. When the unit driver UBD receives it, the inverting output signal n3 thereof is turned to the high level such as the power supply voltage VDD of the circuit.

When the internal output signal do0 is changed from the high level to the low level, a high level signal is outputted from the output terminal n12 of the flip-flop F/F2 included in the signal generating circuit PRO1, while a high level signal, which is the inverting output signal of the directly preceding signal do0, is outputted from the output terminal QB of the flip-flop F/F1. At the same time the internal output clock signal ck is turned to the low level and a high level signal is outputted to the MOS inverter circuit N1. Owing to this fact, the output of the logical product circuit AND3, i.e. the output terminal n2 of the signal generating circuit PRO1, is turned to the high level. When the unit driver UBD receives it, the non-inverting output signal n4 thereof drops by about 0.5 V from the high level of the power supply voltage to be turned to the low level of the transmitted signal, although it is not restricted specifically thereto. Thereafter, the internal clock signal ck is turned to the high level and a low level signal is outputted from the output n13 of the MOS inverter circuit N1. When the unit driver UBD receives it, the non-inverting output signal n4 thereof is turned to the high level such as the power supply voltage VDD of the circuit.

Therefore the unit driver UBD according to the present embodiment stops output operation by the output circuit, in the case where the logical value of internal output signals do0 supplied one after another in synchronism with the clock signal ck is in accordance with the logical value of the directly preceding cycle. The unit driver as indicated in FIG. 2 acts as a Schmitt trigger type receiving circuit having a hysteresis characteristic as described previously and can hold received data as far as the logic of the differential signal of the transmission lines L0 is not inverted so that the interruption of output operation by the unit driver UBD has no bad influences on the receiving operation. By using the signal driving circuit BD according to the present embodiment it is possible to define the pulse width, etc. of the first and the second control signal n1 and n2 and to increase stability of signal transmission.

Figure 8:
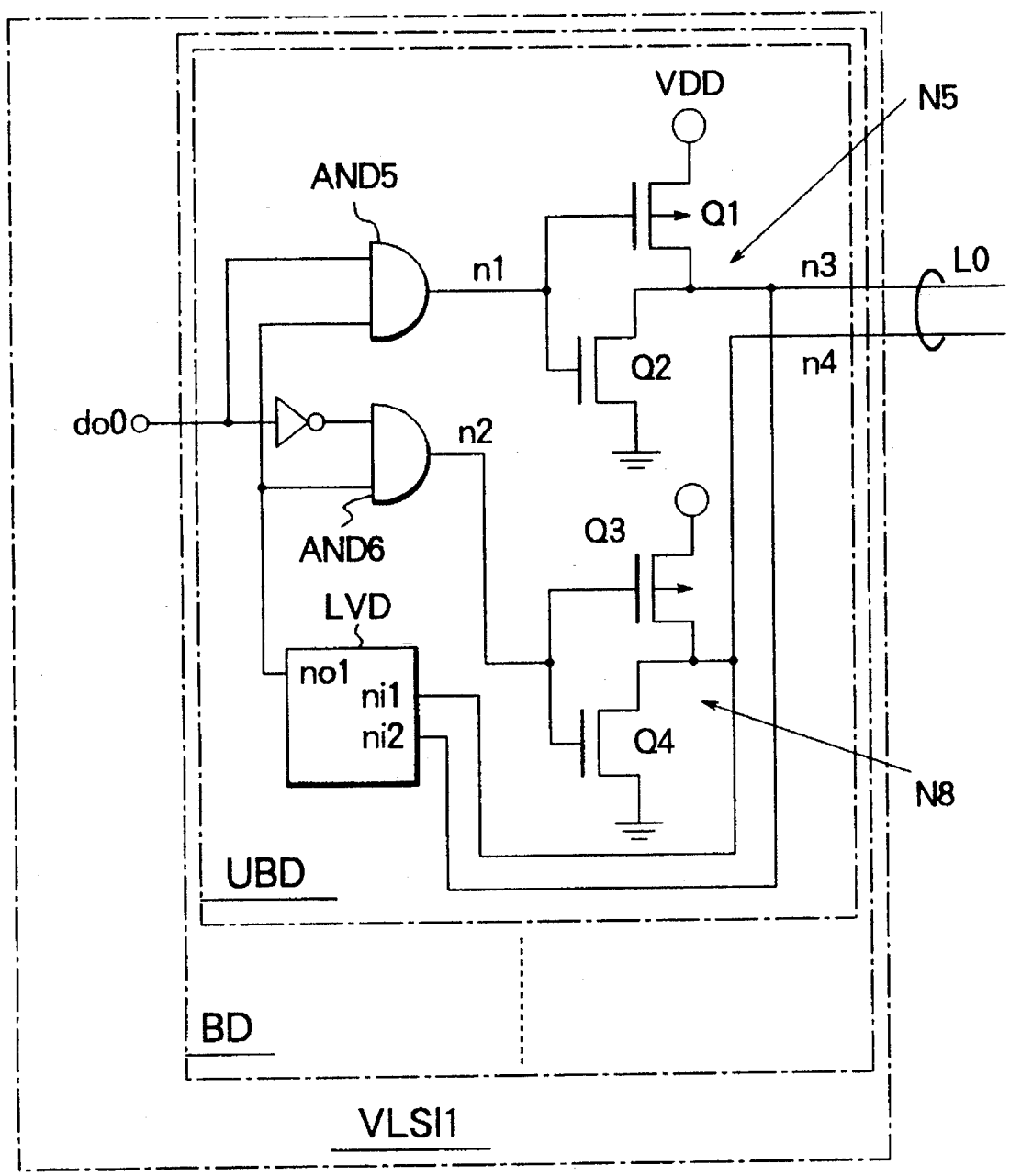
FIG. 8 is a circuit diagram showing the signal driving circuit according to a third embodiment of the present invention.

FIG. 8 shows a circuit diagram of the signal driving circuit BD according to a third embodiment. Also the signal driving circuit BD indicated in the figure is connected with the signal receiving circuit BR as indicated in FIG. 2 through transmission lines L0.

The unit driver UBD indicated in FIG. 8 includes a level detecting circuit LVD detecting that the output level of the inverting output signal n3 or the non-inverting output signal n4 of the unit driver UBD exceeds a predetermined value and logical product circuits AND5 and AND6, although it is not restricted specifically thereto. The level of the inverting output signal n3 and the non-inverting output signal n4 of the unit driver UBD is observed by input terminals ni1 and ni2 of the level detecting circuit LVD. When level drop of the level of the inverting output signal n3 or the non-inverting output signal n4 from the power supply voltage VDD exceeds a predetermined value, the level detecting circuit LVD detects it and outputs a low level pulse through an output terminal no1. When this is received, the output signals n1 and n2 of the logical product circuit AND5 and AND6 are turned to the low level so that the driving MOSFETs Q2 and Q4 are set to the OFF state, while the precharge MOSFETs Q1 and Q3 are set to the ON state. In this way the inverting output signal n3 and the non-inverting output signal n4 are turned to the high level such as the power supply voltage VDD of the circuit. That is, the level of the inverting output signal n3 and the non-inverting output signal n4 is limited. Consequently, owing to the fact that the transmission lines L0 are not lowered to a value below a predetermined level e.g. by means of the unit driver UBD indicated in FIG. 8, it is possible to contribute to increase the speed of output operation and to decrease in the electric power consumption.

Figure 9:
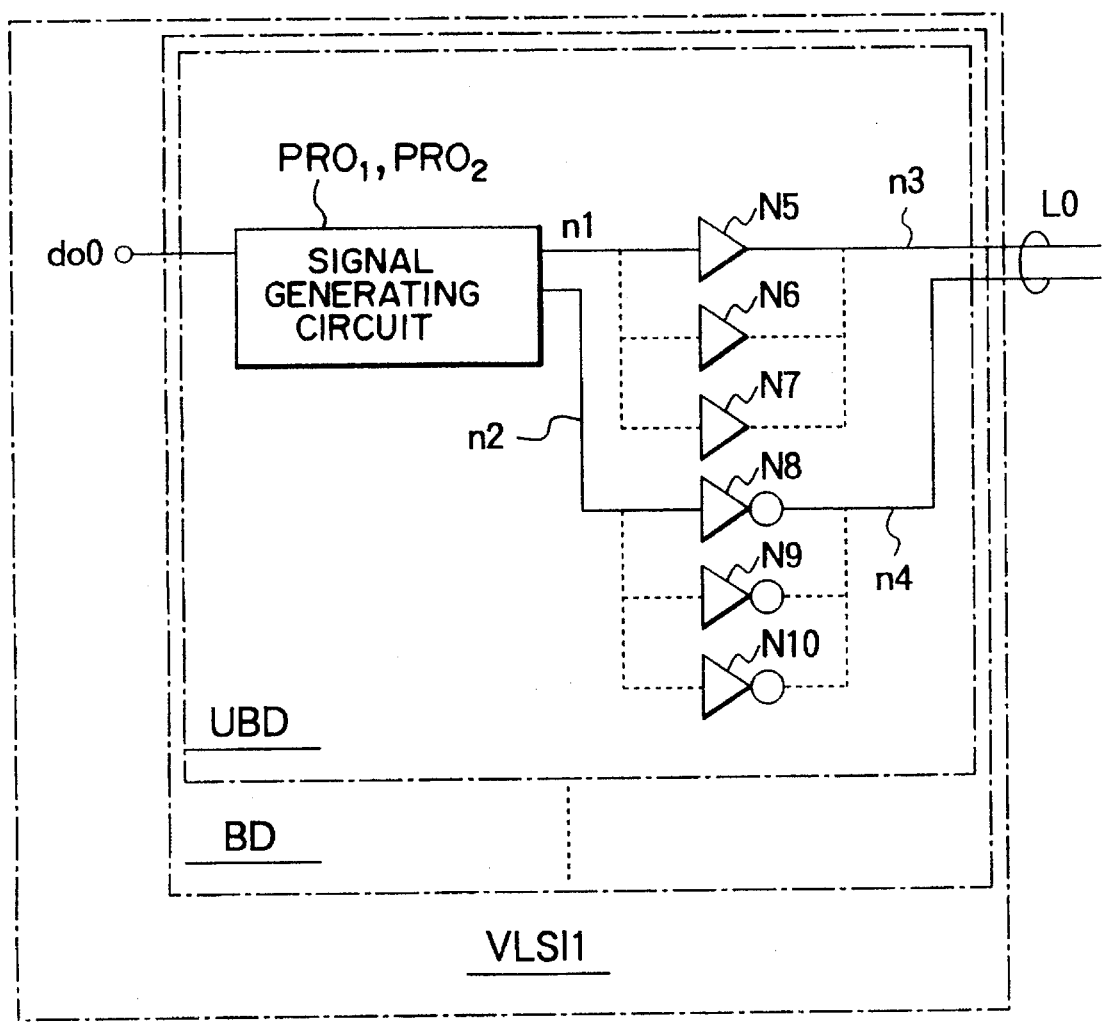
FIG. 9 is a circuit diagram showing the signal driving circuit according to a fourth embodiment of the present invention.

FIG. 9 shows a circuit according to a fourth embodiment of the signal driving circuit BD. Also the signal driving circuit BD indicated in the figure is connected with the signal receiving circuit BR as indicated in FIG. 2 through transmission lines L0.

The unit driving circuit UBD indicated in FIG. 9 is an embodiment for optimizing driving power of output circuits or driving circuits with respect to the length of the transmission lines L0 or load capacity thereof. For example, according to the present embodiment, the unit driver UBD is provided with a plurality of driver circuits or output circuits N5–N7, N8–N10 together with signal generating circuits PR01 and PR02 as described previously, for the respective signal line of the transmission lines L0. In FIG. 9, N5 is a driver such as a CMOS inverter including the MOSFETs Q1 and Q2 described previously. N6 and N7 have a circuit construction similar thereto and are connected with that driver N5 in parallel. Similarly N8 is a driver such as a CMOS inverter composed of the MOSFETs Q3 and Q4 described previously. N9 and N10 have a circuit construction similar thereto and are connected with that driver N8 in parallel. The number of drivers to be added may be suitably chosen according to magnitude of the load capacity, etc. In the case where the load capacity is known previously, the number can be determined at a design stage. Otherwise the number may be selected by using master slice of aluminium wiring or through soft ware on the system by using a control register, etc.

Figure 10:
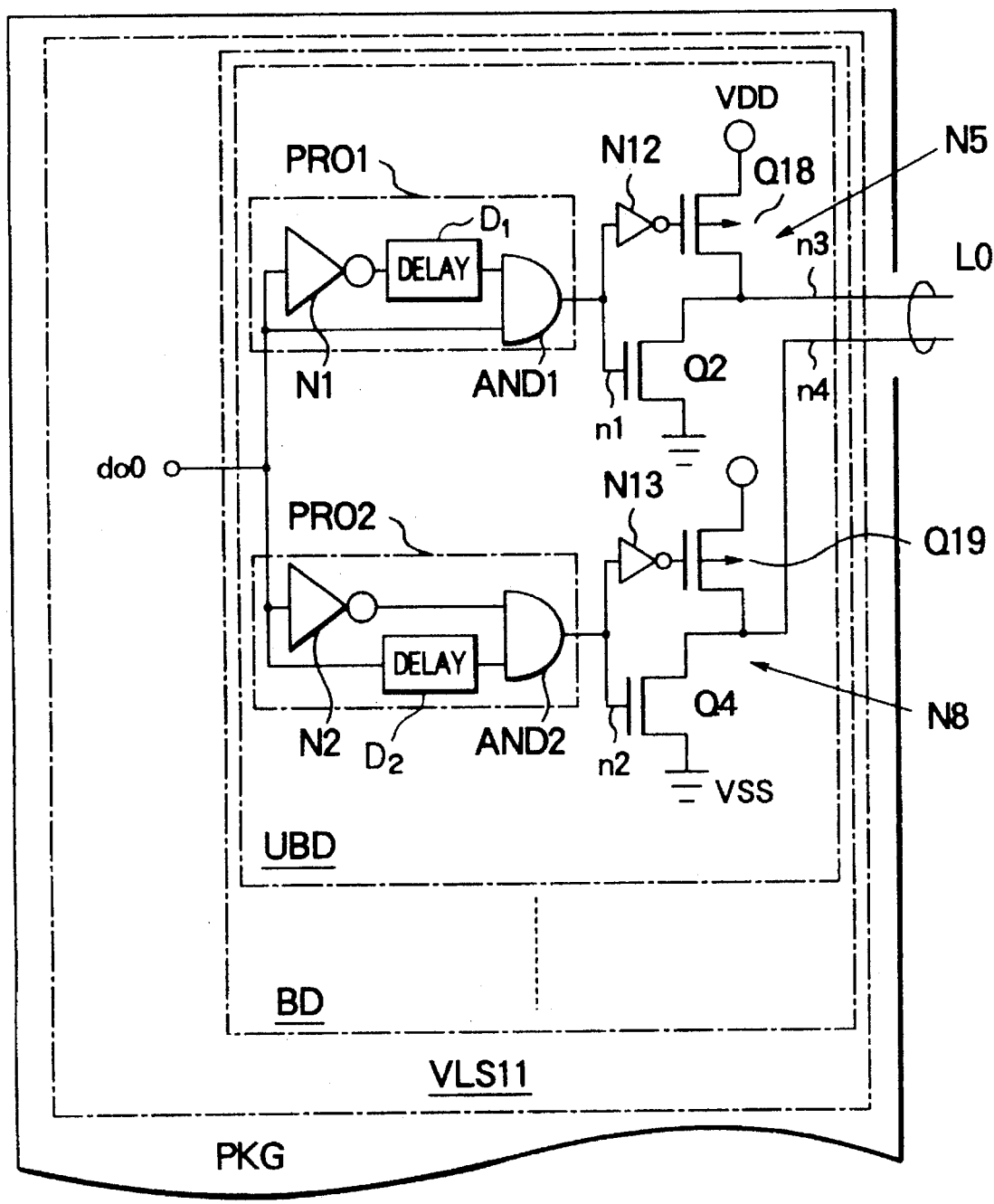
FIG. 10 is a circuit diagram showing the signal driving circuit according to a fifth embodiment of the present invention.

FIG. 10 shows a circuit according to a fourth embodiment of the signal driving circuit BD. Also the signal driving circuit BD indicated in the figure is connected with the signal receiving circuit BR as indicated in FIG. 2 through transmission lines L0. The signal driving circuit BD indicated in the present embodiment differs from that indicated in FIG. 1 in that precharge MOSFETs in the driver are N channel type MOSFETs Q18 and Q19. Because of the fact that the precharge MOSFETs Q18 and Q19 are of N channel type, the precharged level of the transmission lines is lowered by a threshold voltage of the relevant MOSFETs and in this driver it is possible to eliminate a fear of latch-up which is peculiar to a CMOS circuit. Consequently, in the case where the output of the relevant driver is connected with an external terminal on a circuit board of the signal driving circuit, live-insertion (to insert or pull-out the circuit board in a state where the power supply remains to be turned-on for the circuit) of the circuit board can be effected. However, in this case, inverters N12 and N13 are connected between the precharge N channel type MOSFETs Q18 and Q19 and the logic gates AND1 and AND2, respectively.

Figure 11:
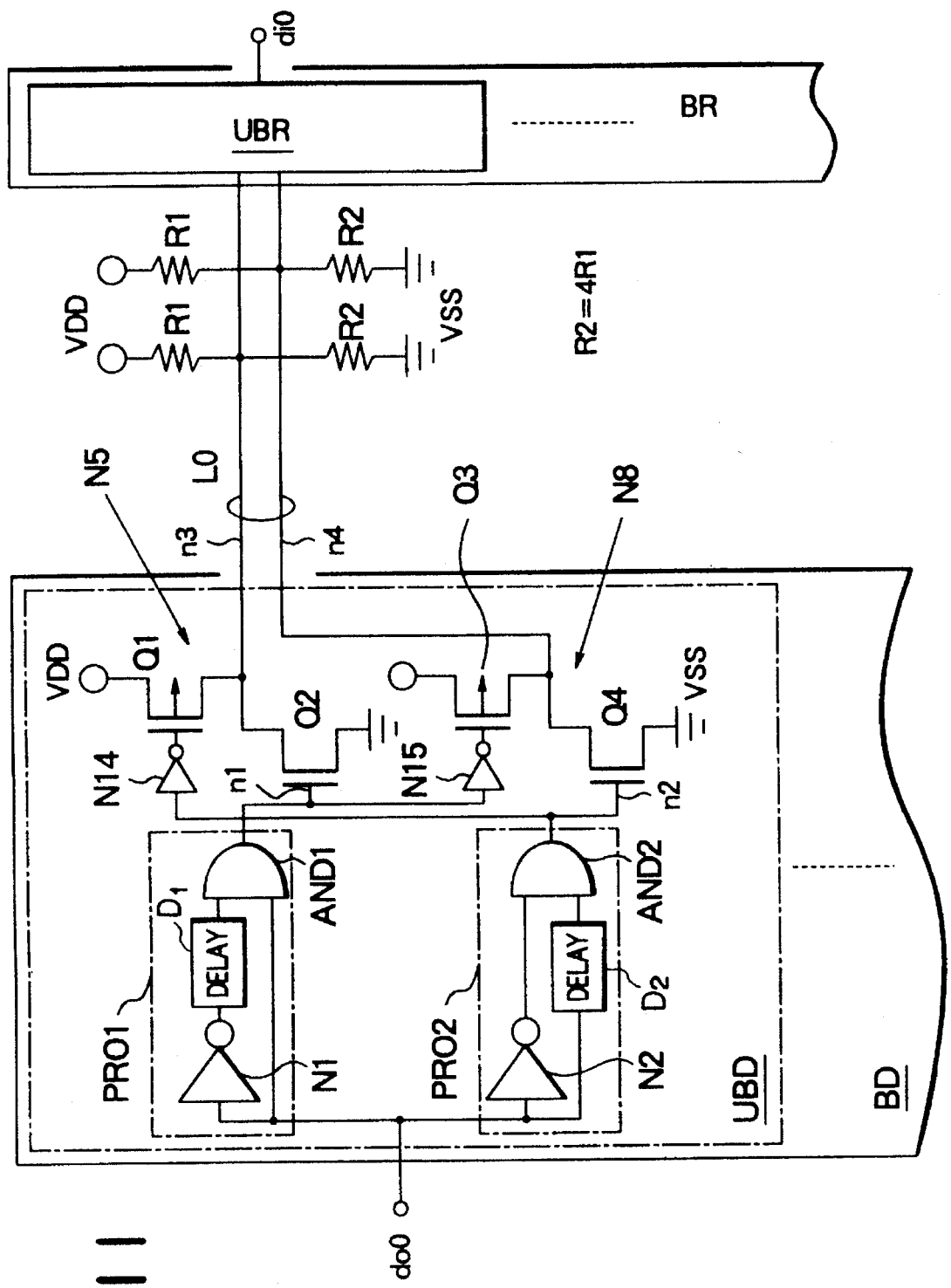
FIG. 11 is a circuit diagram showing an embodiment of a differential type MOS transmission circuit in case where signals on a pair of transmission lines are made completely differential.

FIG. 11 shows a circuit of the differential type MOS transmitting circuit according to another embodiment where signals on transmission lines are of complete differential type. The circuit according to the present embodiment differs from those indicated in FIGS. 1 and 2 in the construction of the pair of transmission lines LO and control form for the drivers N5 and N8.

That is, the pair of transmission lines L0 receive a divided voltage obtained by means of a series circuit consisting of resistors R1 and R2 e.g. such as MOS resistors. This divided voltage is given thereto as a reference potential. For example, the resistor R2 has a resistance four times as large as R1 and the reference voltage is closer to the power supply voltage. The driver N5 is constructed of a series circuit of a P channel type MOSFET Q1 and an N channel type MOSFET Q2. However, the driving manner thereof by the outputs n1 and n2 of the signal generating circuit differs from those indicated in FIGS. 1, 6 and 8 and the pair of transmission lines L0 are driven around the reference potential in a differential manner. According to the present embodiment, a pulse-like control signal n1 is supplied to the gate of the MOSFET Q3 through an inverter N15 and at the same time to the gate of the MOSFET Q2. On the other hand, a pulse-like control signal n2 is supplied to the gate of the MOSFET Q1 through an inverter N14 and at the same time to the gate of the MOSFET Q4. Since the other construction is identical to those indicated in FIGS. 1 and 2, identical items are indicated by using same reference numerals and detailed explanation thereof will be omitted.

In the embodiment indicated in FIG. 11 the MOSFETs Q2 and Q3 are turned to the ON state in synchronism with a rising pulse of the signal n1. As a result, one of the pair of transmission lines L0 is charged with respect to the reference potential and the other is discharged with respect to the reference potential. Therefore the pair of transmission lines L0 are driven in a differential manner. Correspondence of the signal lines charged and discharged also during a period of variations of a rising pulse of the signal n2 is reversed with respect to that described above and they are driven similarly in a differential manner. Also in the present embodiment, similarly to the embodiment described above, it is possible to realize increase in the signal transmission speed and decrease in the electric power consumption. Although electric power consumption increases slightly with respect to that observed in the preceding embodiments, because current flowing through the series resistors R1 and R2 takes place, since both signals on the pair of transmission lines vary, in other words since the pair of transmission lines are driven around the reference potential in a differential manner, the present embodiment is more excellent than the others in the high signal transmission speed.

Figure 12:
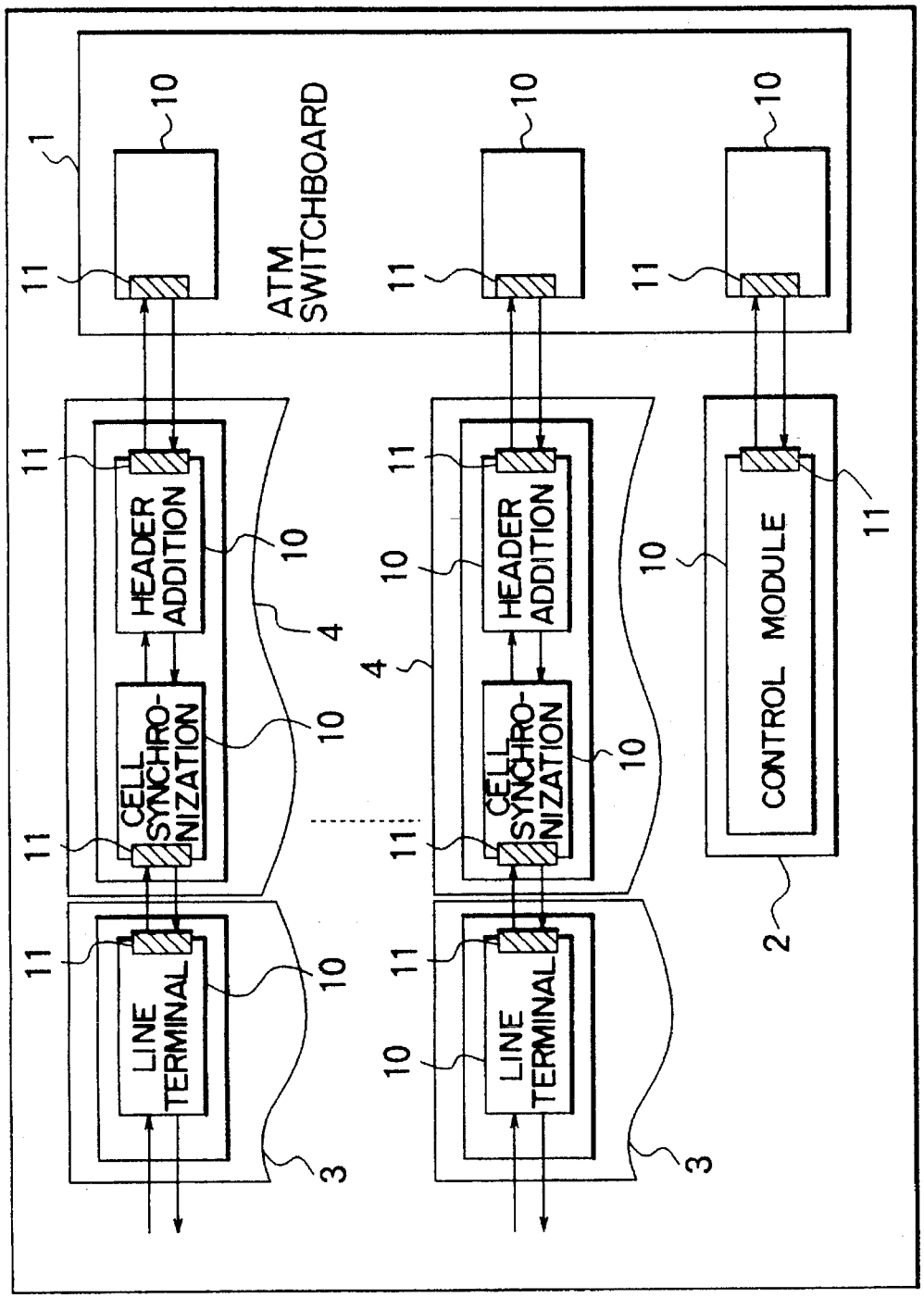
FIG. 12 is a block diagram showing an example of an ATM switch system representing an example of the digital processing device.

FIG. 12 shows an example of block diagrams representing ATM switching systems as an example where the present invention is applied to the digital processing device. The ATM switching system indicated in the figure is contained in an ATM switchboard used in an ISDN. It is an electronic circuit package having e.g. 32 input lines and 32 output lines, which includes an ATM switchboard 1, a control module board 2, and a line terminal board 3 having a number of line terminals and cell synchronization header addition boards 4 corresponding to support lines. In the figure, a numeral 10 represents an LSI having a respective predetermined function and 11 indicates a signal transmission circuit BD, BR. Each circuit block contained in each LSI includes a signal driving circuit BD and a signal receiving circuit BR and they (BD, BR) are connected with each other through transmission lines. Since an ATM switching system itself has no direct relation to the present invention, detailed explanation thereof will be omitted.

Figure 13:
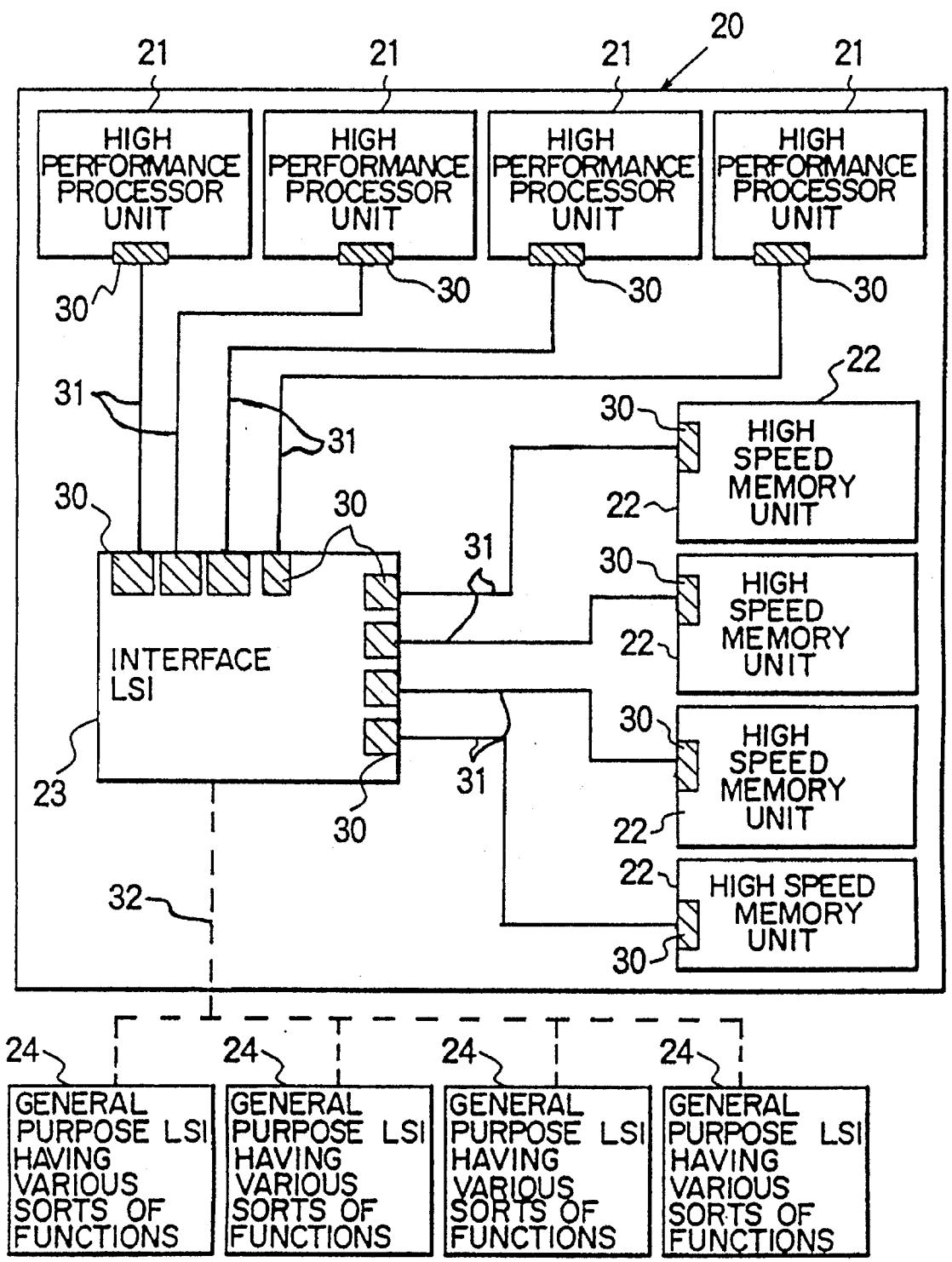
FIG. 13 is a block diagram showing an example of a work station, to which the present invention is applied.

FIG. 13 shows a block diagram of an example of a work station to which the present invention is applied. In FIG. 13, a work station 20 includes e.g. a plurality of high performance processor units 21, a plurality of high speed memory units 22 and an interface LSI 23. The interface LSI 23 is connected with interface LSIs (general purpose LSIs having various sorts of functions) 24 for external peripheral apparatuses such as printers, keyboards, etc. Each of circuit blocks 30 contained in various sorts of units incorporated in the work station includes the signal driving circuit BD and the signal receiving circuit BR described previously, which are connected with each other through transmission lines 31. In this way it is possible to realize decrease in electric power consumption attendant on signal transmission within the work station and increase in operation speed. Further the work station is connected with the exterior e.g. through buses 32 of TTL level.

Figure 14:
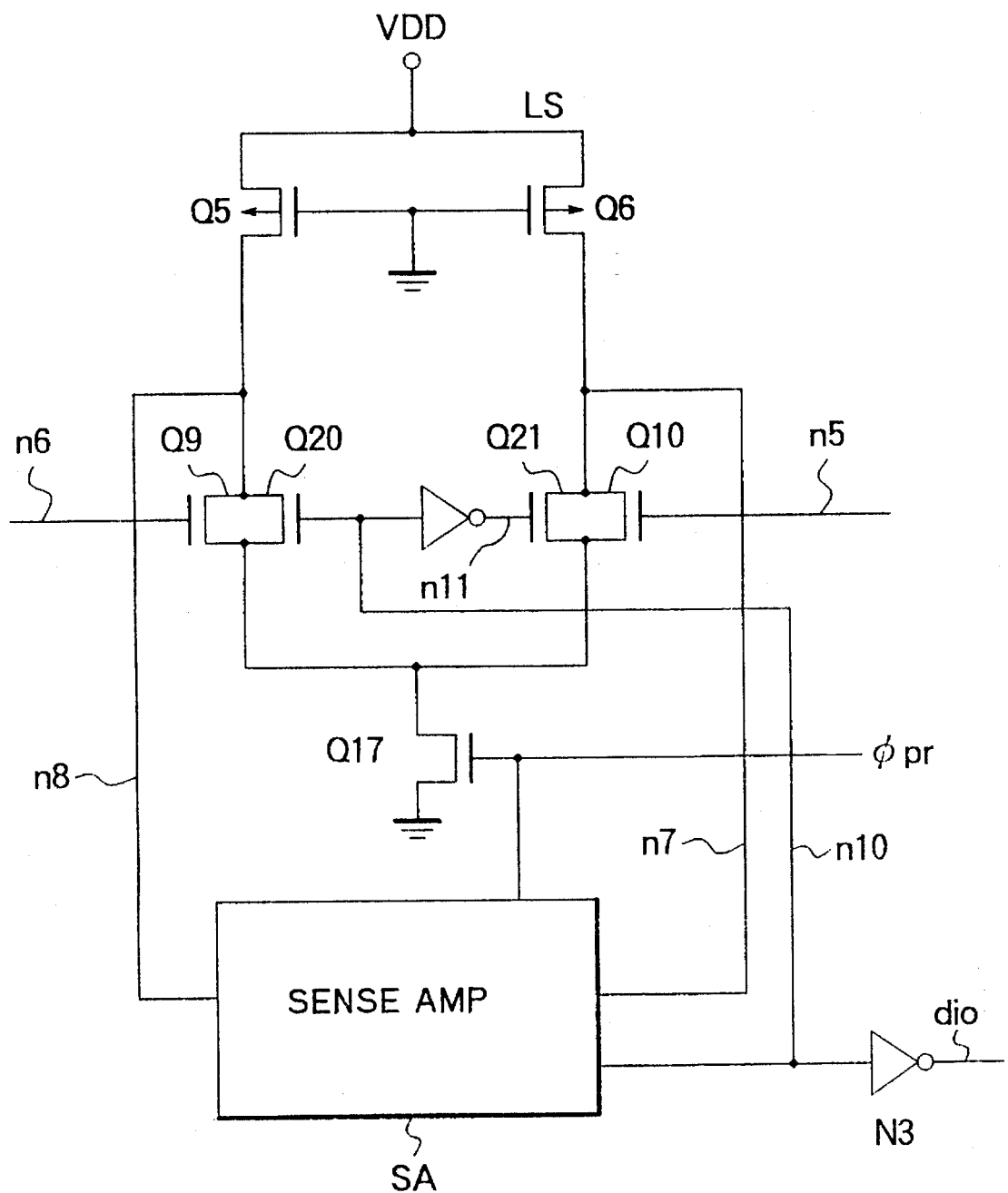
FIG. 14 is a circuit diagram showing a second embodiment of the level shift circuit.

FIG. 14 shows a second embodiment of the level shift circuit. The level shift circuit indicated in the figure is so constructed that N channel type MOSFETs Q20 and Q21 are connected with differential input MOSFETs Q9 and Q10 in parallel as positive feedback MOSFETs in lieu of the MOSFETs Q7 and Q8 indicated in FIG. 2 and the signal n10 is supplied to the gate of the MOSFET Q20, while the signal n11 is supplied to the gate of the MOSFET Q21. Since the other construction is identical to that indicated in FIG. 2, detailed explanation thereof will be omitted. Also in this embodiment, similarly to that indicated in FIG. 2, the output signals n11 and n10 of the sense amplifier SA, which are in phase to the inverting input signal n5 and the non-inverting input signal n6 from the transmission lines, respectively, are inputted to the gates of the MOSFETs Q21 and Q20, respectively. In this way the ratio of a synthesized impedance of the MOSFETs Q9 and Q20 to a synthesized impedance of the MOSFETs Q10 and Q21 is varied and a still greater level difference is formed between the inverting output signal n8 and the non-inverting output signal n7 of the level shift circuit LS. That is, the level difference between the inverting output signal n8 and the non-inverting output signal n7 obtained by variations in the input to the level shift circuit LS is increased by positive feedback of the output of the sense amplifier SA. Consequently the level shift circuit LS acts as a Schmitt trigger type circuit having a hysteresis characteristic in the input and output due to the Operation thereof by positive feedback.

Figure 15:
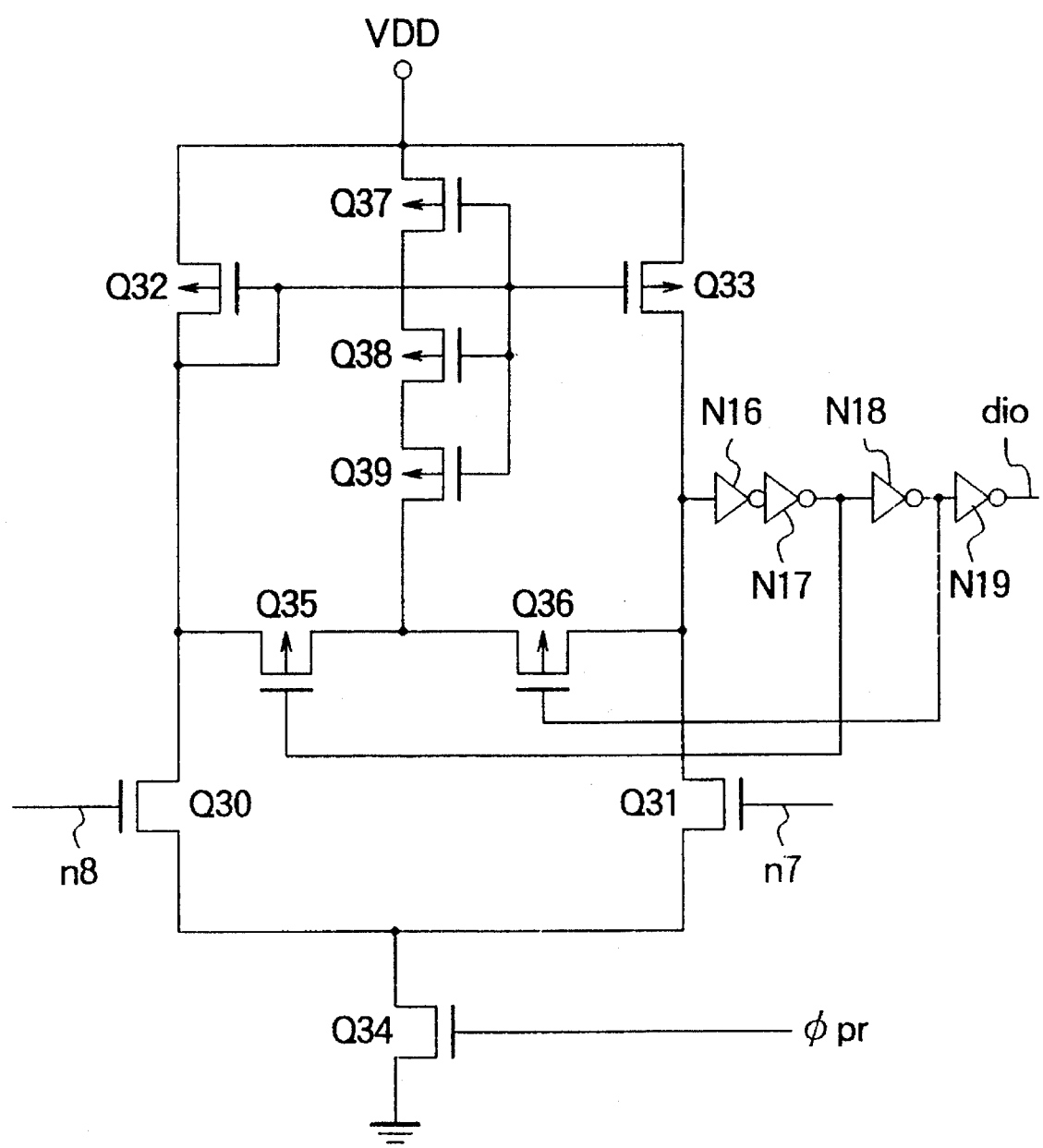
FIG. 15 is a circuit diagram of a Schmitt trigger type differential receiving circuit showing another embodiment of the signal receiving circuit.

FIG. 15 shows a Schmitt trigger type differential receiving circuit as another embodiment of the signal receiving circuit. In a first stage of the differential receiving circuit indicated in the figure there is disposed a level shift circuit provided with a pair of current amplifying circuits having an output terminal, which is a connecting point between an input MOSFET receiving the level of the transmission lines at the gate and a load element connected in series, and the pair of current amplifying circuits make voltage at the output terminal vary, depending on an input voltage to the input MOSFET, although it is not specifically indicated in the figure. The level shift circuit not indicated in the figure has a circuit construction, in which the MOSFETs Q7 and Q8 are omitted in the level shift circuit indicated in FIG. 2. The differential receiving circuit according to the present embodiment includes N channel type differential input MOSFETs Q30 and Q31, whose gates receive signals n8 and n7, respectively, outputted from such a level shift circuit; a current mirror load including P channel type MOSFETs Q32 and Q33 connected between the drains of the MOSFETs Q30 and Q31 and the power supply voltage VDD; a power switch MOSFET Q34 connected between a common source of the MOSFETs Q30 and Q31 and the ground potential of the circuit and switch-controlled by the timing signal φpr; and inverters N16–N19 connected in series in 4 stages with the drain of the MOSFET Q31. In this Schmitt trigger type differential receiving circuit, in order to obtain hysteresis characteristics between the inputs n7 and n8 and the output di0 as described previously, a pair of P channel type MOSFETs Q35 and Q36 are connected between the drain of the MOSFET Q30 and the drain of the MOSFET Q31 in series. Further there are disposed P channel type MOSFETs Q37–Q39 connected in series in 3 stages between a connecting node of MOSFETs Q35 and Q36 and the power supply voltage VDD and the gates thereof are biased by the gate voltage of the MOSFET Q33. The MOSFETs Q35 and Q36 described above effect switching operation in a complementary manner by outputs of inverters N17 and N18.

In the Schmitt trigger type differential receiving circuit according to the present embodiment, the MOSFETs Q37–Q39 act as load defining the intensity of the current flowing selectively through one of the MOSFETs Q35 and Q36. For example, when the output di0 is turned to the high level due to the fact that the level of the input signal n7 is made lower than that of the input signal n8, the low level output of the inverter N18 is fedback positively to the gate of the MOSFET Q36 and in this way the MOSFET Q36 supplies current to the drain of the MOSFET Q31 to raise voltage level of the drain. Consequently, in a state where the positive feedback is applied, even if voltage level of the input signal n7 approaches that of the input signal n8 or even if they are in accordance with each other, the high level of the output signal di0 is maintained and this state is held until the input signals n8 and n7 are mutually logically inverted. When the output di0 is turned to the low level due to the fact that the level of the input signal n8 is made lower than that of the input signal n7, a hysteresis characteristic is obtained, similarly to those described previously, owing to current supplying operation through the MOSFETs Q35. Further, in the differential receiving circuit, if an operating point of the differential amplification can be set closer to the power supply voltage, the level shift circuit may not be necessarily disposed in the first stage thereof.

The present invention has following advantages, but it is a matter of course that they are not limited thereto.

(1) Since signals are transmitted under control using control signals varying pulse-like in accordance with rising variations or falling variations of input signals, by which both of a pair of transmission lines are in a precharged state or either one of them is in a discharged state and a signal receiving circuit receiving them has an input threshold voltage with respect to output logic values provided with a hysteresis characteristic having a level smaller than a potential difference between the precharged level and the discharged level described above, it is possible to realize high speed signal transmission with small amplitudes and low electric power consumption.

(2) Further, since the small amplitudes on the transmission lines can be realized without using any external resistors mounted externally to a respective LSI on a circuit board, it is possible to increase packaging efficiency on the circuit board in a digital processing device composed mainly of CMOS or bipolar.CMOS circuits.

(3) The precharged level of the transmission lines can be the power supply voltage by constructing the driver by a precharge MOSFET and a discharge MOSFET having conductivity types different from each other, connected in series. On the contrary, by constructing it by a discharge MOSFET and a precharge MOSFET, both of which are of N channel type, it is possible to prevent latch-up taking place in a driver of CMOS construction and live-insertion of the circuit board, on which LSIs having signal driving circuits BD in the output stage are mounted, can be made possible.

(4) It is possible to increase further signal transmission speed by driving the pair of transmission lines in a differential manner around a reference potential, depending on pulse-like variations of a first and a second control signal.

(5) It is possible to have driving power correspond easily to load capacity of the transmission lines by providing a plurality of series circuits of precharge MOSFETs and discharge MOSFETs in the driver in a signal driving circuit.

(6) It is possible to obtain such pulse-like variations of the control signals with a simple circuit construction by using gate delay for forming pulse-like varying control signals.

(7) It is possible to define pulse width, etc. of the pulse-like varying control signals with a high precision to increase stability of signal transmission by generating the pulse-like varying control signals in synchronism with a clock signal.

(8) It is possible to clamp the discharge level of the transmission lines at a constant level to stabilize operation of the signal receiving circuit by detecting the discharge level of the transmission lines to control a period, during which the control signals vary pulse-like.

(9) It is possible to intend to increase operation speed of the signal driving circuit by having the signal receiving circuit provided with a differential amplifying circuit and by adopting a level shift circuit, which shifts a signal level on the pair of transmission lines to a level in the neighborhood of an operating point of the differential amplifying circuit to supply it to the differential amplifying circuit.

(10) It is possible to realize easily a hysteresis characteristic in the signal receiving circuit by having the signal receiving circuit provided with a differential amplifying circuit and by adopting a level shift circuit therein constructed by connecting feedback MOSFETs, which magnify the difference between output levels of a pair of current amplifying circuits by inputting outputs of the differential amplifying circuit, with the pair of current amplifying circuits.

(11) It is possible to have a differential amplifying circuit bear the hysteresis characteristic of the signal receiving circuit by having the differential amplifying circuit provided with a pair of differential input MOSFETs and an active load and by adopting a level shift circuit therein constructed by connecting feedback MOSFETs, which enlarge a difference between currents flowing through the pair of differential input MOSFETs by inputting outputs obtained from a connecting point between the active load and one of the differential input MOSFETs for feedback, with current paths through the differential input MOSFETs, respectively.

What is claimed is:

1. A differential type MOS digital transmission circuit comprising:

at least a signal driving circuit including, signal generating circuits generating a first control signal varying pulse-like based on a transition of an input signal of two logical values, from a first logical value to a second logical value and a second control signal varying pulse-like based on a transition of said input signal from said second logical value to said first logical value, a first driver whose output is connected with a first transmission line of a pair of first and second transmission lines and which discharges said corresponding first transmission line during a period of pulse-like variation of said first control signal and precharges said corresponding first transmission line during the other period, and a second driver whose output is connected with said second transmission line and which discharges said corresponding second transmission line during a period of pulse-like variation of said second control signal and precharges said corresponding second transmission line during the other period, thereby generating a precharged state of both said transmission lines and a discharged state of either one of said transmission lines; and a Schmitt trigger type signal receiving circuit (UBR) provided in pair with said at least a signal driving circuit and including an output generating circuit whose input is connected with said pair of transmission lines and which amplifies in a differential manner a potential difference between said pair of transmission lines formed by discharge of either one of said transmission lines to generate an output signal of two logical values, and said output generating circuit having a positive feedback circuit of the output signal to provide an input threshold voltage with respect to said two logical values which has a hysteresis characteristic of a level lower than a voltage difference between said precharged level and said discharged level.

2. A differential type MOS transmission circuit according to claim 1, wherein:

said first driver in which a connecting node between a precharge MOSFET and a discharge MOSFET having conductivity types different from each other connected in series is connected with said first transmission line operates push-pull fashion by said first control signal to effect the discharge operation during a period where said first control signal varies pulse-like; and said second driver in which a connecting node between a precharge MOSFET and a discharge MOSFET having conductivity types different from each other connected in series is connected with said second transmission line operates in a push-pull fashion by said second control signal to effect the discharge operation during a period where said second control signal varies pulse-like.

3. A differential type MOS transmission circuit according to claim 1, wherein:

said first driver including an inverter element connected in series with either one of a precharge MOSFET and a discharge MOSFET, in which a connecting node between said precharge MOSFET and said discharge MOSFET having the same conductivity type connected in series is connected with said first transmission line, effects a push-pull operation by said first control signal to effect discharge operation during a period where said first control signal varies pulse-like; and said second driver including an inverter element connected in series with either one of a precharge MOSFET and a discharge MOSFET, in which a connecting node between said precharge MOSFET and said discharge MOSFET having a same conductivity type connected in series is connected with said second transmission line, effects a push-pull operation by said second control signal to effect discharge operation during a period where said second control signal varies pulse-like.

4. A differential type MOS transmission circuit according to claim 1, wherein each of said first driver and said second driver includes a plurality of series circuits of precharge MOSFETs and discharge MOSFETs which are connected in parallel depending on load capacity component of said transmission lines.

5. A differential type MOS transmission circuit according to claim 1, wherein said signal receiving circuit includes a differential amplifying circuit and a level shift circuit which level-shifts the signal level of said pair of transmission lines connected with said input to a level in the neighborhood of a working point of said differential amplifying circuit to supply it thereto and said level shift circuit includes a pair of current amplifying circuits, each of which has an output terminal at a connecting point between an input MOSFET and a load element connected in series, said voltage at said output terminal being varied in accordance with said input voltage to said input MOSFET; and feedback MOSFETs connected witch said respective current amplifying circuits magnifying the difference in the output level of said pair of transmission lines by inputting the output of said differential amplifying circuit for feedback.

6. A differential type MOS transmission circuit according to claim 1, wherein said signal generating circuit includes a first logic circuit to which said input signal and a signal obtained by inverting logically said input signal and delaying a signal thus obtained are inputted to produce said first control signal varying pulse-like during a period where both said inputs have a first logic value, and a second logic circuit to which said signal obtained by inverting said input signal and a signal obtained by delaying said input signal are inputted to produce said second control signal varying pulse-like during said period where both said inputs have said first logic value.

7. A differential type MOS transmission circuit according to claim 6, wherein said signal generating circuit includes a third logic circuit which outputs said first control signal varying pulse-like with a pulse width of said clock with which variation timing of said input signal is synchronized, when said input signal has said first logical value; a fourth logic circuit which outputs said second control signal varying pulse-like with a pulse width of said clock with which variation timing of said input signal is synchronized, when said input signal has said second logic value; and a fifth logic circuit determining whether said logical value of said input signal is coincident with said logical value of said input signal in the directly preceding clock cycle or not to output a third control signal for inhibiting pulse-like variation of said first and said second control signal upon coincidence thereof.

8. A differential type MOS transmission circuit according to claim 7, wherein said signal generating circuit includes a level detecting circuit detecting that said discharged level of said pair of transmission lines is lowered to a predetermined level; a sixth logic circuit receiving said input signal and a detection signal provided from said level detecting circuit to generate said first control signal varying pulse-like during a period from a point of time where said input signal is changed to said first logical value to a point of time where lowering of said discharged level is revealed by said detection signal; and a seventh logic circuit receiving said input signal and said detection signal provided from said level detecting circuit to generate said second control signal varying pulse-like during a period from a point of time where said input signal is changed to said second logic value to a point of time where lowering of said discharged level is revealed by said detection signal.

9. A differential type MOS transmission circuit according to claim 1, wherein said signal receiving circuit includes a differential amplifying circuit and a level shift circuit, which level-shifts the signal level of said pair of transmission lines connected with said input to a level in the neighborhood of an operating point of said differential amplifying circuit to supply it thereto;

said level shift circuit includes a pair of current amplifying circuits, each of which has an output terminal at a connecting point between an input MOSFET and a load element connected in series, said voltage at said output terminal being varied in accordance with said input voltage to said input MOSFET;

said differential amplifying circuit includes a pair of differential input MOSFETs connected with said output terminal of said current amplifying circuit;

active loads connected with said pair of differential input MOSFETs; and feedback MOSFETs connected with said respective differential input MOSFETs magnifying said difference in said current flowing through each of said pair of differential input MOSFETs by inputting said output obtained from said connecting point between said active loads and one of said differential input MOSFETs for feedback.

10. A differential type MOS transmission circuit comprising:

at least a signal driving circuit including;

signal generating circuits for generating a first control signal varying pulse-like, based on a transition of an input signal indicative of two logical values, from a first logical value to a second logical value and a second control signal varying pulse-like, based on a transition of said input signal from said second logical value to said first logical value;

a first driver whose output is connected with one transmission line set forcedly at a reference potential and which discharges said corresponding one transmission line during a period of pulse-like variation of said first control signal and charges said corresponding one transmission line during a period of pulse-like variation of said second control signal; and a second driver whose output is connected with the other transmission line set forcedly at said reference potential and which discharges said corresponding other transmission line during a period of pulse-like variation of said second control signal and charges said corresponding other transmission line during a period of pulse-like variation of said first control signal;

thereby forming three states in total, i.e. a state where both said transmission lines are at said reference potential and two states where either one of said transmission lines is at the precharged state and the other is at said discharged state; and a Schmitt trigger type signal receiving circuit provided in pair with said at least a signal driving circuit and having inputs connected with said pair of transmission lines and which amplifies in a differential manner a potential difference between said pair of transmission lines to generate an output signal indicative of two logical values, and an input threshold voltage for said two logical values having a hysteresis characteristic with a level, which is lower than a voltage difference between said reference potential and the charged level and in addition lower than a voltage difference between said reference potential and the discharged level, through a positive feedback of said output signal.

* * * * *